(12) United States Patent
Kishi et al.

(10) Patent No.: US 10,510,285 B2
(45) Date of Patent: Dec. 17, 2019

(54) DISPLAY DEVICE AND DRIVE METHOD THEREFOR

(71) Applicant: Sharp Kabushiki Kaisha, Sakai, Osaka (JP)

(72) Inventors: Noritaka Kishi, Sakai (JP); Hiroyuki Furukawa, Sakai (JP); Katsuya Otoi, Sakai (JP); Kazuyoshi Yoshiyama, Sakai (JP); Tamotsu Sakai, Sakai (JP); Naoko Gotoh, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 164 days.

(21) Appl. No.: 15/548,237

(22) PCT Filed: Jan. 27, 2016

(86) PCT No.: PCT/JP2016/052238
§ 371 (c)(1),
(2) Date: Aug. 2, 2017

(87) PCT Pub. No.: WO2016/125641
PCT Pub. Date: Aug. 11, 2016

(65) Prior Publication Data
US 2017/0365205 A1 Dec. 21, 2017

(30) Foreign Application Priority Data
Feb. 3, 2015 (JP) .................................. 2015-019160

(51) Int. Cl.
*G09G 3/20* (2006.01)
*G09G 3/30* (2006.01)
(Continued)

(52) U.S. Cl.
CPC ........... *G09G 3/2092* (2013.01); *G01R 19/10* (2013.01); *G01R 31/2825* (2013.01); *G09G 3/20* (2013.01);
(Continued)

(58) Field of Classification Search
CPC .... G09G 3/20; G09G 3/3233; G09G 2330/08; G09G 2330/02; G09G 2320/0693;
(Continued)

(56) References Cited

U.S. PATENT DOCUMENTS

2004/0108518 A1 6/2004 Jo
2009/0244047 A1 10/2009 Mizutani et al.
(Continued)

FOREIGN PATENT DOCUMENTS

JP 2004-4675 A 1/2004
JP 2009-244654 A 10/2009
(Continued)

*Primary Examiner* — Charles V Hicks
(74) *Attorney, Agent, or Firm* — ScienBiziP, P.C.

(57) ABSTRACT

A measurement circuit includes a plurality of measurement units, performs, at a same timing, a main measurement for measuring a current or a voltage with respect to a pixel circuit with supplying a measurement voltage to a part of the measurement units and a dummy measurement for measuring a current or a voltage with supplying a dummy signal to remaining measurement units, and performs a calculation on a result of the main measurement and a result of the dummy measurement. As the dummy signal, a signal with which a value to be measured is approximately zero is used. The measurement result of the current or the voltage is used for correcting a video signal. With this, a display device which can remove noise in measurement when measuring the current or the voltage with respect to the pixel circuit is provided.

20 Claims, 12 Drawing Sheets

(51) Int. Cl.
*G09G 3/3233* (2016.01)
*G01R 19/10* (2006.01)
*G01R 31/28* (2006.01)
*G09G 3/3266* (2016.01)
*G09G 3/3275* (2016.01)

(52) U.S. Cl.
CPC .............. *G09G 3/30* (2013.01); *G09G 3/3233* (2013.01); *G09G 3/3266* (2013.01); *G09G 3/3275* (2013.01); *G09G 2300/0842* (2013.01); *G09G 2300/0861* (2013.01); *G09G 2310/0291* (2013.01); *G09G 2310/08* (2013.01); *G09G 2320/0295* (2013.01); *G09G 2320/045* (2013.01); *G09G 2320/0693* (2013.01); *G09G 2330/02* (2013.01); *G09G 2330/08* (2013.01); *G09G 2330/12* (2013.01)

(58) Field of Classification Search
CPC ......... G09G 2320/045; G09G 2310/08; G09G 2330/12; G09G 3/3275; G09G 3/3266; G09G 3/2092; G09G 2310/0291; G09G 2300/0842; G09G 2300/0861; G09G 2320/0295; G09G 3/30; H01L 51/50; G01R 31/2825; G01R 19/10
See application file for complete search history.

(56) References Cited

U.S. PATENT DOCUMENTS

2012/0032940 A1* 2/2012 Mizukoshi ............. G09G 3/006
 345/212
2014/0152642 A1 6/2014 Kim et al.

FOREIGN PATENT DOCUMENTS

JP 2011-164135 A 8/2011
JP 2014-109775 A 6/2014

* cited by examiner

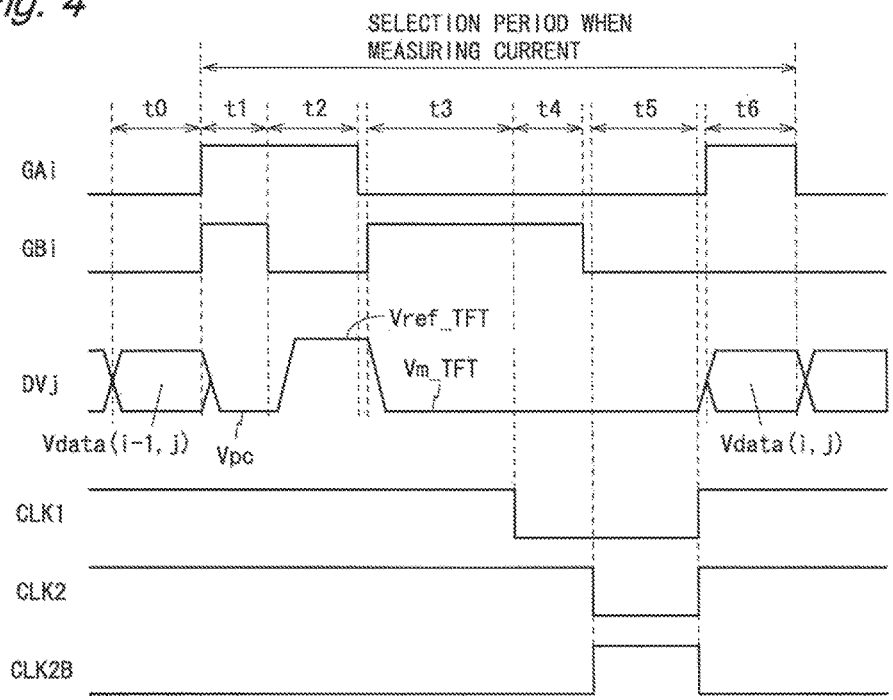
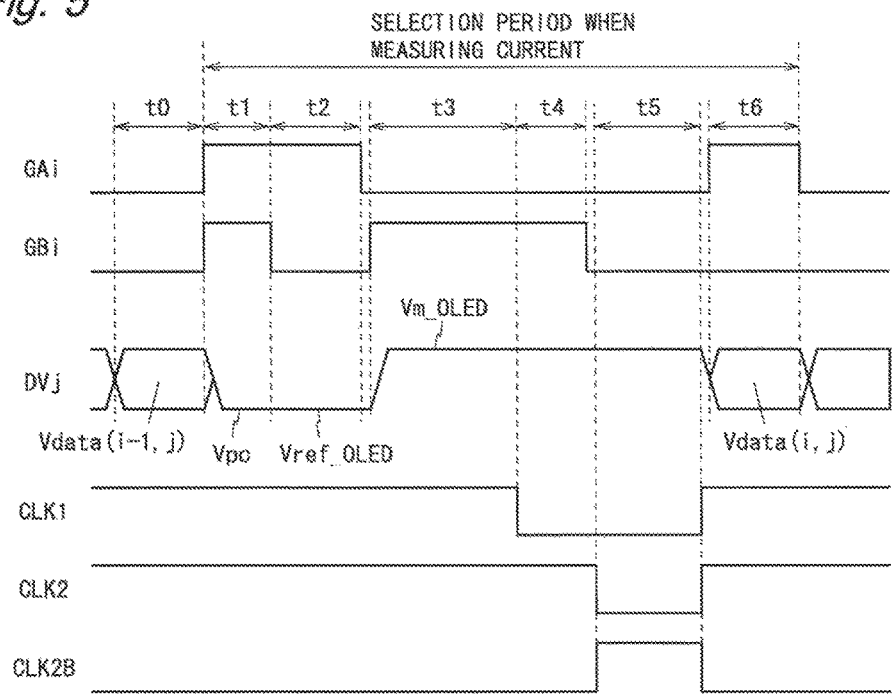

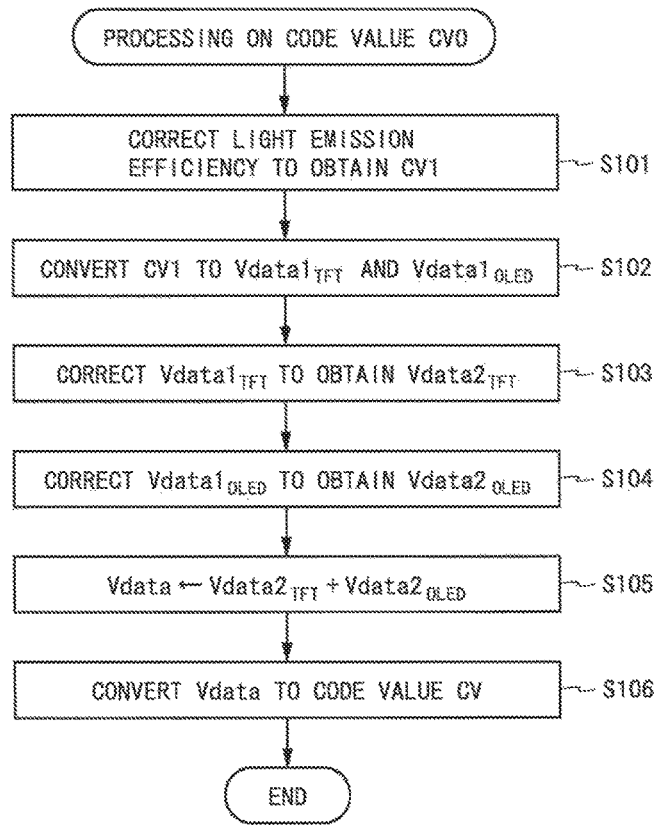

Fig. 8

| OUTPUT /MEASUREMENT CIRCUIT | 1 | 2 | 3 | 4 | 5 | 6 | 7 | 8 | 9 | 10 | 11 | 12 | ... |
|---|---|---|---|---|---|---|---|---|---|---|---|---|---|
| SELECTOR | 1 | | | 2 | | | 3 | | | 4 | | | ... |
| TYPE OF MEASUREMENT | MAIN MEASUREMENT | | | DUMMY MEASUREMENT | | | MAIN MEASUREMENT | | | DUMMY MEASUREMENT | | | ... |

SWITCHING ↓↑

| OUTPUT /MEASUREMENT CIRCUIT | 1 | 2 | 3 | 4 | 5 | 6 | 7 | 8 | 9 | 10 | 11 | 12 | ... |
|---|---|---|---|---|---|---|---|---|---|---|---|---|---|
| SELECTOR | 1 | | | 2 | | | 3 | | | 4 | | | ... |
| TYPE OF MEASUREMENT | DUMMY MEASUREMENT | | | MAIN MEASUREMENT | | | DUMMY MEASUREMENT | | | MAIN MEASUREMENT | | | ... |

Fig. 9

| OUTPUT /MEASUREMENT CIRCUIT | 1 | 3 | 5 | ... | 2p-1 | 2 | 4 | 6 | ... | 2p | 2p+1 | 2p+3 | ... |
|---|---|---|---|---|---|---|---|---|---|---|---|---|---|
| SELECTOR | 1 | | | | | 2 | | | | | 3 | | ... |
| TYPE OF MEASUREMENT | MAIN MEASUREMENT | | | | | DUMMY MEASUREMENT | | | | | MAIN MEASUREMENT | | ... |

SWITCHING ↓↑

| OUTPUT /MEASUREMENT CIRCUIT | 1 | 3 | 5 | ... | 2p-1 | 2 | 4 | 6 | ... | 2p | 2p+1 | 2p+3 | ... |
|---|---|---|---|---|---|---|---|---|---|---|---|---|---|
| SELECTOR | 1 | | | | | 2 | | | | | 3 | | ... |
| TYPE OF MEASUREMENT | DUMMY MEASUREMENT | | | | | MAIN MEASUREMENT | | | | | DUMMY MEASUREMENT | | ... |

Fig. 11

| TERMINAL | t0 | t1 | t2 | t3 | t4 | ... | tp | CALCULATION RESULT |
|---|---|---|---|---|---|---|---|---|
| D1 | MEASURE-MENT | ADC t1 (D1) | ADC t2 (D1) | ADC t3 (D1) | ADC t4 (D1) | ... | ADC tp (D1) | |
| S1 | MEASURE-MENT | ADC t1 (S1) | | | | | | ADC t1 (S1) − ADC t1 (D1) |
| S2 | MEASURE-MENT | | ADC t2 (S2) | | | | | ADC t2 (S2) − ADC t2 (D1) |
| S3 | MEASURE-MENT | | | ADC t3 (S3) | | | | ADC t3 (S3) − ADC t3 (D1) |
| S4 | MEASURE-MENT | | | | ADC t4 (S4) | | | ADC t4 (S4) − ADC t4 (D1) |
| ... | ... | | | | | ... | | ... |
| Sp | MEASURE-MENT | | | | | | ADC tp (Sp) | ADC tp (Sp) − ADC tp (D1) |

DISPLAY DEVICE AND DRIVE METHOD THEREFOR

TECHNICAL FIELD

The present invention relates to a display device, especially to a display device having a pixel circuit including an electro-optical element such as an organic EL element, and a drive method therefor.

BACKGROUND ART

In recent years, an organic EL (Electro Luminescence) display device has been attracting attention as a thin, light-weight, fast-response display device. The organic EL display device includes a plurality of pixel circuits arranged two-dimensionally. The pixel circuit of the organic EL display device includes an organic EL element, and a drive transistor connected in series with the organic EL element. The drive transistor controls an amount of current flowing through the organic EL element, and the organic EL element emits light at brightness in accordance with the amount of the flowing current.

In a manufacturing process, variation occurs in characteristics of elements in the pixel circuit. Furthermore, the characteristics of the elements in the pixel circuit fluctuate with a passage of time. For example, characteristics of the drive transistor individually degrade in accordance with light emission brightness and light emission time. The same holds true for characteristics of the organic EL element. Thus, even when a same voltage is applied to gate terminals of the drive transistors, variation occurs in the light emission brightness of the organic EL elements.

Thus, in order to perform high image quality display in the organic EL display device, there is known a method in which a video signal is corrected so that variation and fluctuation of the characteristics of the organic EL element and the drive transistor are compensated. For example, Patent Document 1 discloses an organic EL display device for compensating for the fluctuation of the characteristics of the organic EL element by measuring a voltage between terminals of the organic EL element when a detection current flows through the organic EL element, and correcting a video signal based on the measured voltage.

In relation to the present invention, Patent Document 2 discloses an organic EL display device including a sensing unit shown in FIG. 15 in order to obtain a threshold voltage of the drive transistor and degradation information of the organic EL element. In FIG. 15, an amplification unit 91 amplifies a voltage of a node in the pixel circuit. An error compensation unit 92 includes two operational amplifiers, four capacitors C1 to C4, and 12 switches. The error compensation unit 92 compensates for an error component of elements included in the amplification unit 91 and the error compensation unit 92, for example, by controlling the switches to alternately store a voltage in the capacitors C3, C4.

PRIOR ART DOCUMENTS

Patent Documents

[Patent Document 1] Japanese Laid-open Patent Publication No. 2009-244654
[Patent Document 2] Japanese Laid-Open Patent Publication No. 2014-109775

SUMMARY OF THE INVENTION

Problems to be Solved by the Invention

In the following, there is considered an organic EL display device including a current measurement circuit for measuring a current flowing through the pixel circuit, in order to compensate for the variation and the fluctuation of the characteristics of the elements in the pixel circuit. In such an organic EL display device, due to noise occurring in a display unit and noise included in a power supply voltage or a reference voltage supplied to the current measurement circuit, noise may be imposed on a current measurement result, and an S/N ratio of the current measurement result may degrade.

When the S/N ratio of the current measurement result degrade, the current flowing through the pixel circuit can not be measured correctly, and the video signal can not be corrected correctly so that the variation and the fluctuation of the characteristics of the elements in the pixel circuit are compensated. Thus, even if the video signal is corrected based on the current measurement result in the organic EL display device, it may not be possible to perform high image quality display being affected by the noise in the current measurement.

In the sensing unit disclosed in Patent Document 2, a timing for measuring an error component of a voltage and a timing for measuring a signal voltage is different. Thus, when noise levels are different in these two timings, the error component of the elements included in the amplification unit 91 and the error compensation unit 92 can not be compensated sufficiently.

A similar problem as described above occurs in an organic EL display device including a voltage measurement circuit for measuring a voltage of a node in the pixel circuit, in order to compensate for the variation and the fluctuation of the characteristics of the elements in the pixel circuit.

Accordingly, an object of the present invention is to provide a display device which can remove noise in measurement when measuring a current or a voltage with respect to a pixel circuit.

Means for Solving the Problems

According to a first aspect of the present invention, there is provided an active-matrix type display device including: a display unit including a plurality of scanning lines, a plurality of data lines, and a plurality of pixel circuits arranged two-dimensionally; a scanning line drive circuit, configured to drive the scanning lines; a data line drive circuit configured to drive the data lines; and a measurement circuit including a plurality of measurement units and configured to measure a current or a voltage with respect to the pixel circuit, wherein the measurement circuit is configured to perform, at a same timing, a main measurement for measuring the current or the voltage with respect to the pixel circuit with supplying a measurement signal to a part of the measurement units and a dummy measurement for measuring a current or a voltage with supplying a dummy signal to at least a part of remaining measurement units, and perform a calculation on a result of the main measurement and a result of the dummy measurement.

According to a second aspect of the present invention, in the first aspect of the present invention, the measurement circuit is configured to supply, as the dummy signal, a signal with which a value to be measured is approximately zero when performing the dummy measurement, and obtain a difference between the result of the main measurement and the result of the dummy measurement.

According to a third aspect of the present invention, in the second aspect of the present invention, the measurement unit is provided corresponding to the data line, and the measurement circuit is configured to measure the current or the voltage with respect to the pixel circuit with supplying the dummy signal to at least the part of the remaining measurement units.

According to a fourth aspect of the present invention, in the third aspect of the present invention, the measurement units are classified into first and second groups, and the measurement circuit is configured to perform the main measurement using the measurement unit in the first group and the dummy measurement using the measurement unit in the second group at a same timing in a first period, and perform the main measurement using the measurement unit in the second group and the dummy measurement using the measurement unit in the first group at a same timing in a second period.

According to a fifth aspect of the present invention, in the fourth aspect of the present invention, the measurement units are classified into the first and second groups alternately, two or more at a time, in accordance with an alignment order of the corresponding data lines.

According to a sixth aspect of the present invention, in the fourth aspect of the present invention, the measurement units are classified into the first and second groups alternately, one at a time, in accordance with an alignment order of the corresponding data lines.

According to a seventh aspect of the present invention, in the fourth aspect of the present invention, the measurement circuit further includes a selector configured to select outputs from the measurement units in the first group, and a selector configured to select outputs from the measurement units in the second group.

According to an eighth aspect of the present invention, in the fifth aspect of the present invention, the pixel circuit has one of a plurality of display colors for each corresponding data line, and the measurement units are classified into the first and second groups alternately, a same number as that of the display colors at a time, in accordance with an alignment order or the corresponding data lines.

According to a ninth aspect of the present invention, in the second aspect of the present invention, the display device further includes one or more dummy measurement target circuits, each of the part of the measurement units is provided corresponding to the data line, and each of the remaining measurement units is provided corresponding to the dummy measurement target circuit, and the measurement circuit is configured to measure the current or the voltage with respect to the dummy measurement target circuit with supplying the dummy signal to at least the part of the remaining measurement units.

According to a tenth aspect of the present invention, in the ninth aspect of the present invention, the dummy measurement target circuit has a same load as that of the data line.

According to an eleventh aspect of the present invention, in the ninth aspect of the present invention, the measurement circuit further includes a selector configured to select outputs of the part of the measurement units.

According to a twelfth aspect of the present invention, in the second aspect of the present invention, the display device further includes a correction unit configured to correct a video signal to be supplied to the data line drive circuit, based on the current or the voltage measured by the measurement circuit.

According to a thirteenth aspect of the present invention, in the second aspect of the present invention, the pixel circuit includes an electro-optical element, and a drive transistor connected in series with the electro-optical element.

According to a fourteenth aspect of the present invention, in the thirteenth aspect of the present invention, the display device further includes: a correction unit configured to correct a video signal to be supplied to the data line drive circuit, based on the current or the voltage measured by the measurement circuit; and a storing unit configured to store a threshold voltage and a gain of the electro-optical element and the drive transistor for each pixel circuit, wherein the correction unit is configured to obtain the threshold voltage and the gain to be stored in the storing unit, based on the current or the voltage measured by the measurement circuit, and correct the video signal based on the threshold voltage and the gain stored in the storing unit.

According to a fifteenth aspect of the present invention, in the thirteenth aspect of the present invention, the pixel circuit includes: a write control transistor having a first conduction terminal connected to the data line, a second conduction terminal connected to a control terminal of the drive transistor, and a control terminal connected to a first scanning line in the scanning lines; and a read control transistor having a first conduction terminal connected to the data line, a second conduction terminal connected to a connection point of the drive transistor and the electro-optical element, and a control terminal connected to a second scanning line in the scanning lines.

According to a sixteenth aspect of the present invention, in the second aspect of the present invention, the measurement circuit further includes an A/D converter configured to convert an analog signal to a digital value, the analog signal representing a result of measuring the current or the voltage with respect to the pixel circuit, and is configured to perform A/D conversion of the result of the main measurement and A/D conversion of the result of the dummy measurement at a same timing.

According to a seventeenth aspect of the present invention, in the second aspect of the present invention, the measurement circuit is a current measurement circuit configured to measure a current flowing through the pixel circuit.

According to an eighteenth aspect of the present invention, in the seventeenth aspect of the present invention, the data line drive circuit and the current measurement circuit share an amplifier.

According to a nineteenth aspect of the present invention, in the second aspect of the present invention, the measurement circuit is a voltage measurement circuit configured to measure a voltage of a node in the pixel circuit.

According to a twentieth aspect of the present invention, there is provided a drive method for an active-matrix type display device having a display unit including a plurality of scanning lines, a plurality of data lines, and a plurality of pixel circuits arranged two-dimensionally, the method including the steps of: driving the scanning lines; driving the data lines; and measuring a current or a voltage with respect to the pixel circuit using a plurality of measurement units, wherein the measuring includes: performing, at a same timing, a main measurement for measuring the current or the voltage with respect to the pixel circuit with supplying a measurement signal to a part of the measurement units and a dummy measurement for measuring a current or a voltage with supplying a dummy signal to at least a part of remaining measurement units; and performing a calculation on a result of the main measurement and a result of the dummy measurement.

Effects of the Invention

According to the first or twentieth aspect of the present invention, it is possible to remove noise in measurement when measuring the current or the voltage with respect to the pixel circuit, by performing the main measurement and the dummy measurement at the same timing and performing the calculation on the result of the main measurement and the result of the dummy measurement. Furthermore, high image quality display can be performed using the result of measuring the current or the voltage.

According to the second aspect of the present invention, the noise in measurement when measuring the current or the voltage with respect to the pixel circuit can be removed easily, by using the dummy signal with which a value to be measured is approximately zero and obtaining the difference between the result of the main measurement and the result of the dummy measurement.

According to the third aspect of the present invention, the noise in measurement when measuring the current or the voltage with respect to the pixel circuit can be removed without providing a circuit for the dummy measurement, by performing the dummy measurement for measuring the current or the voltage with respect to the pixel circuit.

According to the fourth aspect of the present invention, the current or the voltage can be measured with respect to the pixel circuits having the same number as that of the data lines through two main measurements, by dividing the measurement units into two groups and performing the main measurement and the dummy measurement alternately.

According to the fifth aspect of the present invention, when measuring the current or the voltage with respect to the pixel circuit, the noise in measuring the current or the voltage can be removed effectively, by referring to the result of the dummy measurement with respect to a neighboring pixel circuit.

According to the sixth aspect of the present invention, when measuring the current or the voltage with respect to the pixel circuit, the noise in measuring the current or the voltage can be removed effectively, by referring to the result of the dummy measurement with respect to an adjacent pixel circuit.

According to the seventh aspect of the present invention, it is possible to select the result of the main measurement and the result of the dummy measurement by using the selectors and perform the calculation on the two selected measurement results.

According to the eighth aspect of the present invention, the noise in measuring the current or the voltage can be removed effectively, by performing the main measurement and the dummy measurement with respect to the pixel circuits having the same display color.

According to the ninth aspect of the present invention, it is possible to measure the currents flowing through the pixel circuits having the same number as that of the data lines through one main measurement, by providing the dummy measurement target circuit and performing the dummy measurement for measuring the current or the voltage with respect to the dummy measurement target circuit.

According to the tenth aspect of the present invention, the dummy measurement can be performed under the same condition as that of the main measurement, by using the dummy measurement target circuit having the same load as that of the data line.

According to the eleventh aspect of the present invention, it is possible to select the result of the main measurement using the selector and perform the calculation on the selected result of the main measurement and the result of the dummy measurement.

According to the twelfth aspect of the present invention, high image quality display can be performed by correcting the video signal based on the measured current or the measured voltage.

According to the thirteenth aspect of the present invention, the noise in measurement when measuring the current or the voltage with respect to the pixel circuit can be removed in the display device having the pixel circuit including the electro-optical element and the drive transistor.

According to the fourteenth aspect of the present invention, it is possible to compensate for variation and fluctuation of characteristics of the electro-optical element and the drive transistor and perform high image quality display, by obtaining the threshold voltage and the gain of the drive transistor and the electro-optical element based on the result of measuring the current or the voltage, and correcting the video signal using these values.

According to the fifteenth aspect of the present invention, the noise in measuring the current or the voltage can be removed in the display device having the pixel circuit including the electro-optical element, the drive transistor, the write control transistor, and the read control transistor.

According to the sixteenth aspect of the present invention, the noise in measuring the current or the voltage can be removed effectively, by performing A/D conversion of the result of the main measurement and A/D conversion of the result of the dummy measurement at the same timing.

According to the seventeenth aspect of the present invention, the noise in measurement when measuring the current flowing through the pixel circuit can be removed.

According to the eighteenth aspect of the present invention, a circuit amount of the display device can be reduced by sharing the amplifier between the data line drive circuit and the current measurement circuit.

According to the nineteenth aspect of the present invention, the noise in measurement when measuring the voltage of the node in the pixel circuit can be removed.

BRIEF DESCRIPTION OF THE DRAWINGS

FIG. 4 is a timing chart of a main measurement when detecting characteristics of a drive transistor in the display device shown in FIG. 1.

FIG. 5 is a timing chart of a main measurement when detecting characteristics of an organic EL element in the display device shown in FIG. 1.

FIG. 6 is a flowchart of a correction processing in the display device shown in FIG. 1.

FIG. 7 is a diagram showing a correspondence between the output/measurement circuit and a selector, and a switching method between the main measurement and a dummy measurement in the display device shown in FIG. 1.

FIG. 3 is a diagram showing a correspondence between the output/measurement circuit and the selector, and a switching method between the main measurement and the dummy measurement in a display device according to a second embodiment of the present invention.

FIG. 9 is a diagram showing a correspondence between the output/measurement circuit and the selector, and a switching method between the main measurement and the dummy measurement in a display device according to a third embodiment of the present invention.

FIG. 11 is a diagram showing timings of the main measurement and the dummy measurement in the display device according to the fourth embodiment of the present invention.

MODES FOR CARRYING OUT THE INVENTION

Figure 1:
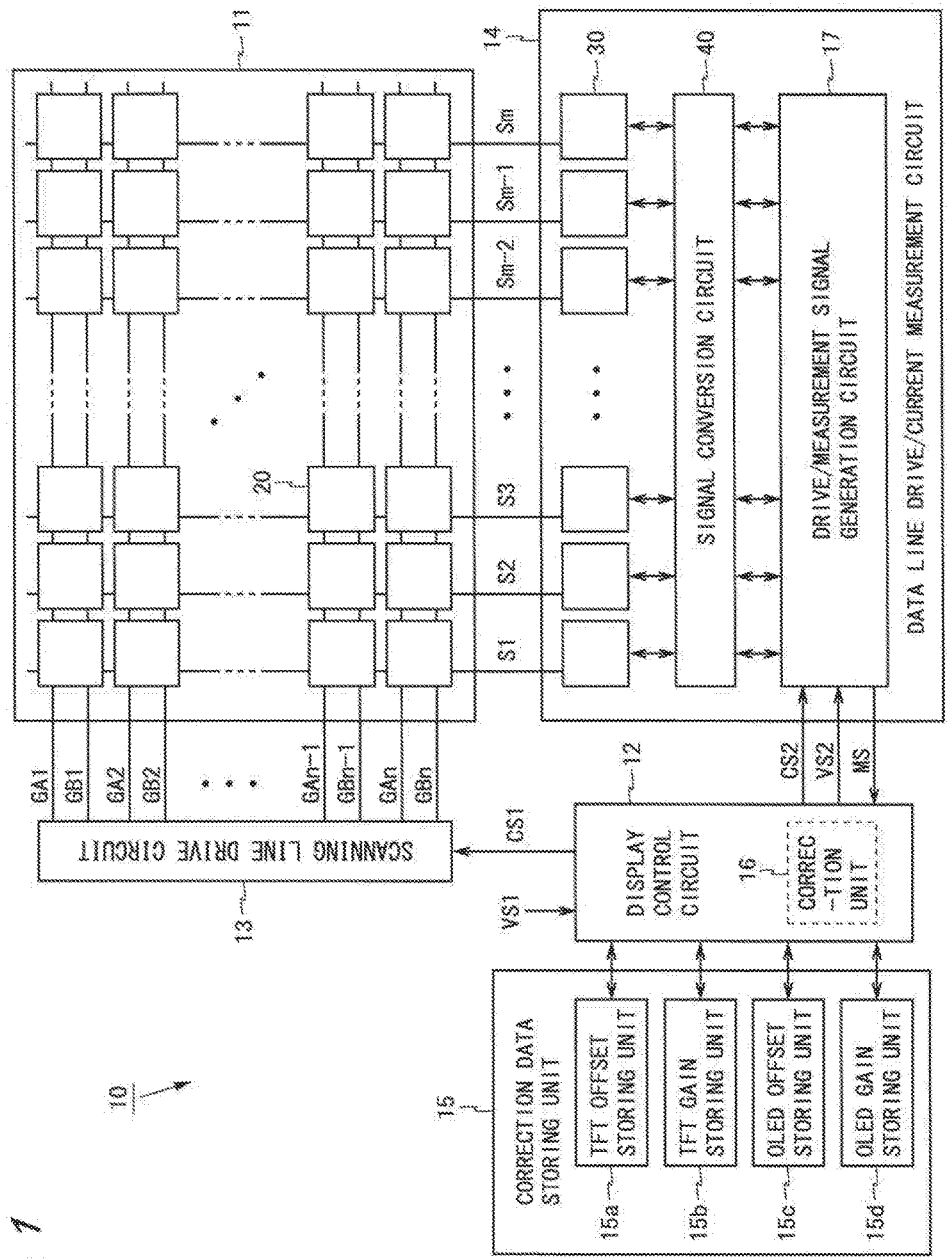
FIG. 1 is a block diagram showing a configuration of a display device according to a first embodiment of the present invention.

In the following, display devices according to embodiments of the present invention will be described referring to the drawings. Each of the display devices according to the embodiments of the present invention is an active-matrix type organic EL display device having a pixel circuit including an organic EL element and a drive transistor. In the following description, a thin film transistor may be referred to as TFT, and an organic EL element may be referred to as OLED (Organic Light Emitting Diode). Furthermore, it is assumed that m, n, and p are integers not less than 2, i is an integer not less than 1 and not more than n, and j is an integer not less than 1 and not more than m.

First Embodiment

FIG. 1 is a block diagram showing a configuration of a display device according to a first embodiment of the present invention. A display device 10 shown in FIG. 1 includes a display unit 11, a display control circuit 12, a scanning line drive circuit 13, a data line drive/current measurement circuit 14 (a combined circuit of a data line drive circuit and a current measurement circuit), and a correction data storing unit 15. The display control circuit 12 includes a correction unit 16. The display unit 11 includes 2n scanning lines GA1 to GAn, GB1 to GBn, m data lines S1 to Sm, and (m×n) pixel circuits 20. The scanning lines GA1 to GAn, GB1 to GBn are arranged in parallel to each other. The data lines S1 to Sm are arranged in parallel to each other so as to intersect with the scanning lines GA1 to GAn, GB1 to GBn perpendicularly. The scanning lines GA1 to GAn and the data lines S1 to Sm intersect at (m×n) points. The (m×n) pixel circuits 20 are arranged two-dimensionally corresponding to the intersections of the scanning lines GA1 to GAn and the data lines S1 to Sm. A high-level power supply voltage ELVDD and a low-level power supply voltage ELVSS are supplied to the pixel circuit 20 using a power supply line or a power supply electrode not shown.

A video signal VS1 is input to the display device 10 from the outside. Based on the video signal VS1, the display control circuit 12 outputs a control signal CS1 to the scanning line drive circuit 13, and outputs a control signal CS2 and a video signal VS2 to the data line drive/current measurement circuit 14. The control signal CS1 includes a gate start pulse and a gate clock, for example. The control signal CS2 includes a source start pulse and a source clock, for example. The video signal VS2 is obtained by correcting the video signal VS1 in the correction unit 16 in a later-described manner.

The scanning line drive circuit 13 and the data line drive/current measurement circuit 14 are provided at an outside of the display unit 11. The scanning line drive circuit 13 and the data line drive/current measurement circuit 14 selectively perform a processing for writing a data voltage in accordance with the video signal VS2 to the pixel circuit 20, and a processing for measuring a current flowing through the pixel circuit 20 when a measurement voltage is written to the pixel circuit 20. Hereinafter, the former is referred to as "writing", and the latter is referred to as "measuring current".

The scanning line drive circuit 13 drives the scanning lines GA1 to GAn, GB1 to GBn based on the control signal CS1. When writing, the scanning line drive circuit 13 sequentially selects one scanning line from among the scanning lines GA1 to GAn, and applies a selection voltage (here, a high-level voltage) to the selected scanning line. With this, m pieces of the pixel circuits 20 connected to the selected scanning line are selected collectively.

The data line drive/current measurement circuit 14 includes a drive/measurement signal generation circuit 17 (a generation circuit of a drive signal and a measurement signal), a signal conversion circuit 40, and m output/measurement circuits 30 (a combined circuit of an output circuit and a measurement circuit), and drives the data lines S1 to Sm based on the control signal CS2. When writing, the data line drive/current measurement circuit 14 applies m data voltages in accordance with the video signal VS2 to the data lines S1 to Sm, respectively. With this, the m data voltages are written to the m selected pixel circuits 20, respectively.

When measuring current, the scanning line drive circuit 13 drives the scanning lines GA1 to GAn, GB1 to GBn at a timing described later. The data line drive/current measurement circuit 14 classifies the m output/measurement circuits 30 into two groups. When measuring current, the output/measurement circuit 30 functions as a measurement unit included in a measurement circuit. When measuring current, the data line drive/current measurement circuit 14 performs a processing (hereinafter referred to as main measurement) for supplying a measurement voltage as a measurement signal to the output/measurement circuit 30 in one of the groups and measuring a current flowing through the pixel circuit 20 when the measurement voltage is written to the pixel circuit 20 connected to the output/measurement circuit 30, and performs a processing (hereinafter referred to as dummy measurement) for supplying a zero voltage as a dummy signal to the output/measurement circuit 30 in the other group and measuring a current flowing through the pixel circuit 20 when the zero voltage is written to the pixel circuit 20 connected to the output/measurement circuit 30.

Here, the zero voltage is a voltage with which a value to be measured by the output/measurement circuit 30 (an expected value of a voltage measurement result) is zero. As the dummy signal, a signal with which a value to be measured is approximately zero (including zero) is used. The data line drive/current measurement circuit 14 measures the current flowing through the pixel circuit 20 by performing the main measurement and the dummy measurement at a same timing and performing a calculation for obtaining a difference between a result of the main measurement and a result of the dummy measurement. The data line drive/current measurement circuit 14 outputs, to the display control circuit 12, a monitor signal MS including a result of measuring the current flowing through the pixel circuit 20.

The correction unit 16 obtains the video signal VS2 by obtaining characteristics of a drive transistor and an organic EL element in the pixel circuit 20 based on the monitor signal MS and correcting the video signal VS1 using the obtained characteristics. The correction data storing unit 15 is a working memory of the correction unit 16. The correction data storing unit 15 includes a TFT offset storing unit 15a, a TFT gain storing unit 15b, an OLED offset storing unit 15c, and an OLED gain storing unit 15d. The TFT offset storing unit 15a stores a threshold voltage of the drive transistor for each pixel circuit 20. The TFT gain storing unit 15b stores a gain of the drive transistor for each pixel circuit 20. The OLED offset storing unit 15c stores a threshold voltage of the organic EL element for each pixel circuit 20. The OLED gain storing unit 15d stores a gain of the organic EL element for each pixel circuit 20.

Figure 2:
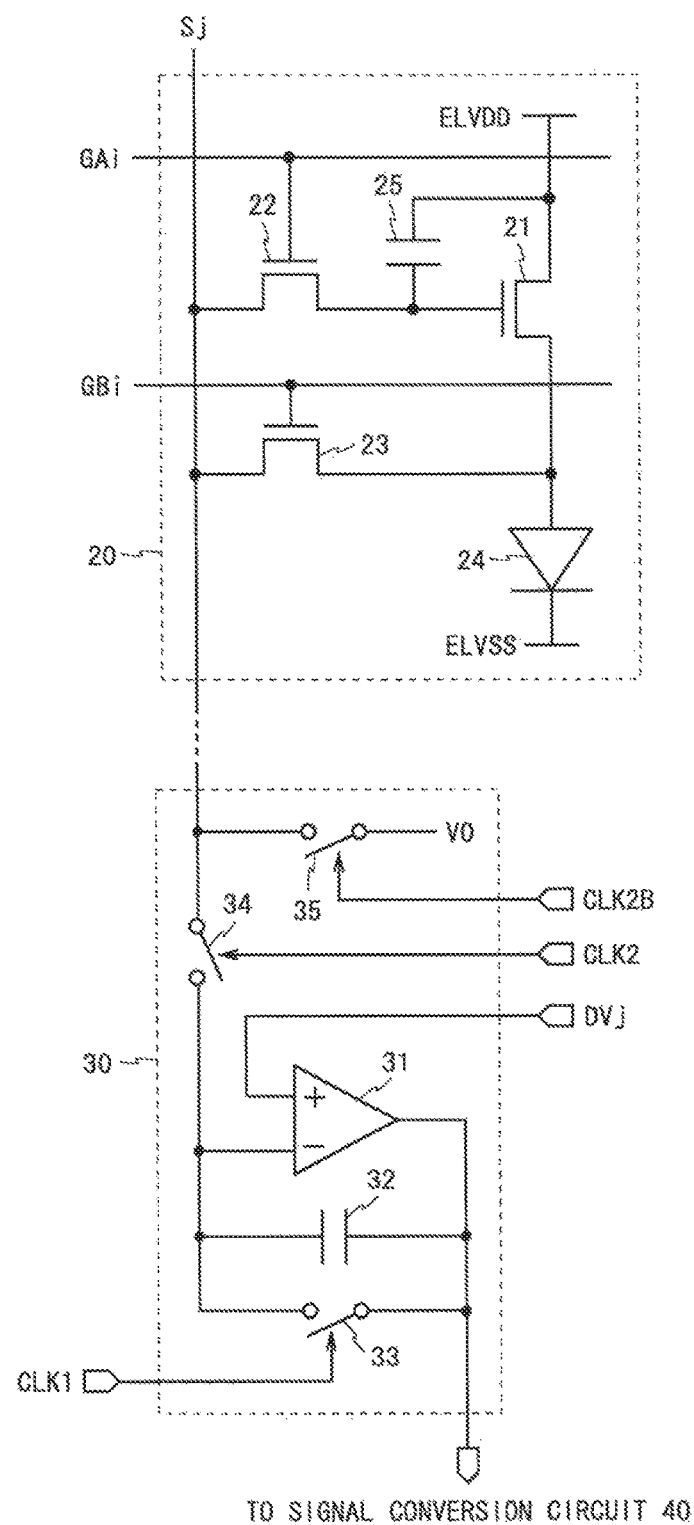
FIG. 2 is a circuit diagram of a pixel circuit and an output/measurement circuit of the display device shown in FIG. 1.

FIG. 2 is a circuit diagram of the pixel circuit 20 and the output/measurement circuit 30. FIG. 2 depicts a pixel circuit 20 in an i-th row and a j-th column and an output/measurement circuit 30 corresponding to a data line Sj. As shown in FIG. 2, the pixel circuit 20 in the i-th row and the j-th column includes transistors 21 to 23, an organic EL element 24, and a capacitor 25, and is connected to scanning lines GAi, GBi and the data line Sj. The transistors 21 to 23 are N-channel type TFTs.

The high-level power supply voltage ELVDD is applied to a drain terminal of the transistor 21. A source terminal of the transistor 21 is connected to an anode terminal of the organic EL element 24. The low-level power supply voltage ELVSS is applied to a cathode terminal of the organic EL element 24. One conduction terminals of the transistors 22, 23 (left-side terminals in FIG. 2) are connected to the data line Sj. The other conduction terminal of the transistor 22 is connected to a gate terminal of the transistor 21, and a gate terminal of the transistor 22 is connected to the scanning line GAi. The other conduction terminal of the transistor 23 is connected to the source terminal of the transistor 21 and the anode terminal of the organic EL element 24, and a gate terminal of the transistor 23 is connected to the scanning line GBi. The capacitor 25 is provided between the gate terminal and the drain terminal of the transistor 21. The transistors 21 to 23 function as a drive transistor, a write control transistor, and a read control transistor, respectively.

The output/measurement circuit 30 corresponding to the data line Sj includes an operational amplifier 31, a capacitor 32, and switches 33 to 35, and is connected to the data line Sj. One end (upper end in FIG. 2) of the switch 34 and one end (left end in FIG. 2) of the switch 35 are connected to the data line Sj. A predetermined voltage V0 is applied to the other end of the switch 35. An output signal DVj of a D/A converter (not shown) corresponding to the data line Sj is applied to a non-inverting input terminal of the operational amplifier 31. An inverting input terminal of the operational amplifier 31 is connected to the other end of the switch 34. The capacitor 32 is provided between the inverting input terminal and an output terminal of the operational amplifier 31. The switch 33 is provided in parallel with the capacitor 32 between the inverting input terminal and the output terminal of the operational amplifier 31. The switches 33 to 35 turn on when switch control signals CLK1, CLK2, CLK2B are in a high level, respectively. The switch control signal CLK2B is an inverted signal of the switch control signal CLK2.

Figure 3:
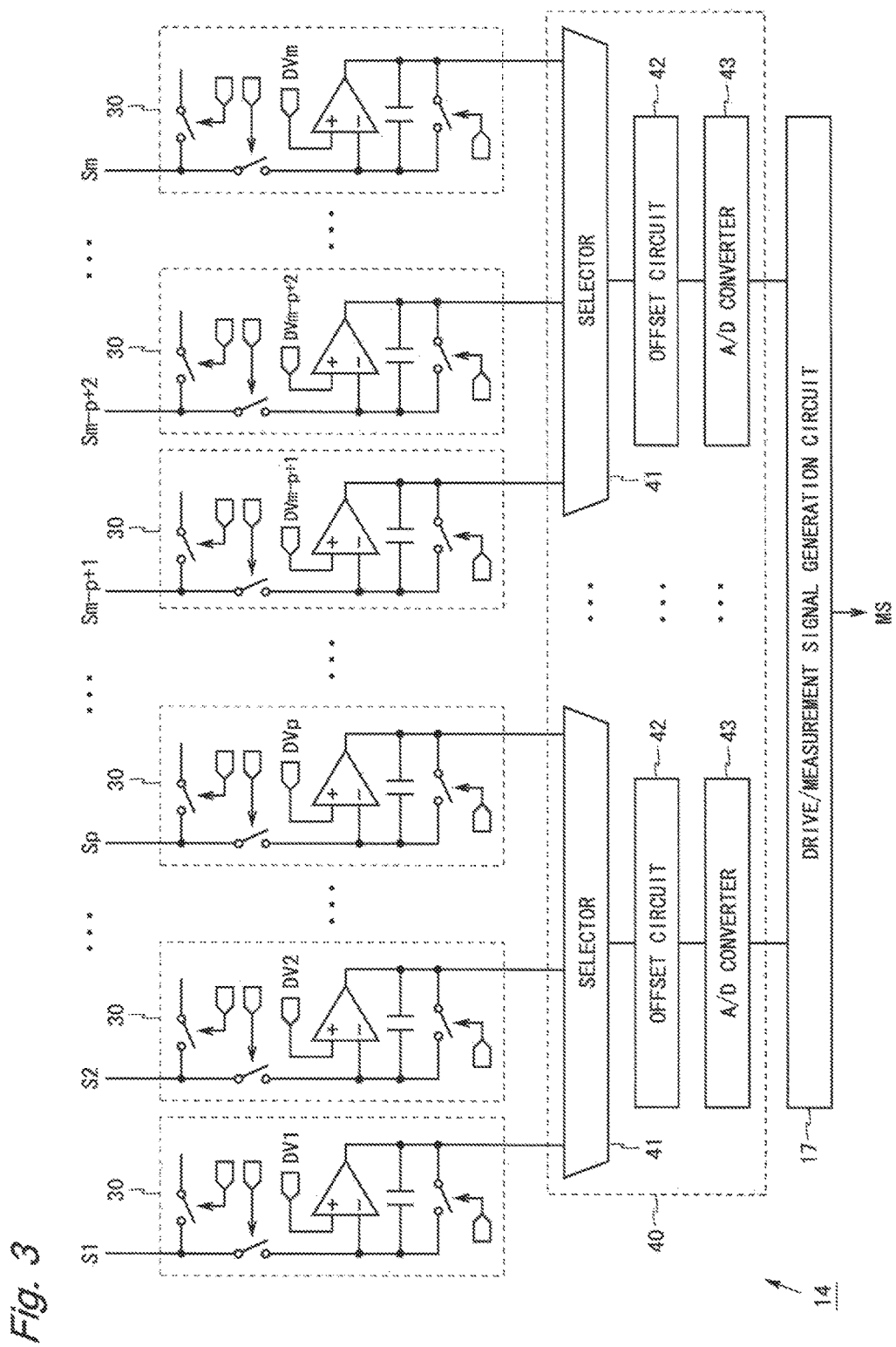
FIG. 3 is a diagram showing a part of a data line drive/current measurement circuit of the display device shown in FIG. 1 in detail.

FIG. 3 is a diagram showing a part of the data line drive/current measurement circuit 14 in detail. As shown in FIG. 3, the m output/measurement circuits 30 are provided corresponding to the m data lines S1 to Sm. The data lines S1 to Sm are classified into (m/p) groups, each group including p data lines. The signal conversion circuit 40 includes (m/p) selectors 41, (m/p) offset circuits 42, and (m/p) A/D converters 43. The selector 41, the offset circuit 42, and the A/D converter 43 are corresponded to one group of the data lines. In a preceding stage of each selector 41, p pieces of the output/measurement circuits 30 are provided. In a next stage of the (m/p) A/D converters 43, the drive/measurement signal generation circuit 17 is provided.

The selector 41 is connected to output terminals of the P output/measurement circuits 30 (output terminals of the operational amplifiers 31). The selector 41 selects one analog signal from among output signals of the p output/measurement circuits 30. The offset circuit 42 adds a predetermined offset to the analog signal selected by the selector 41. The A/D converter 43 converts the analog signal output from the offset circuit 42 to a digital value. The drive/measurement signal generation circuit 17 obtains a difference between a result of the main measurement and a result of the dummy measurement based on the digital values obtained by the (m/p) A/D converters 43, and stores the difference temporarily. Each selector 41 sequentially selects output signals or the p operational amplifiers 31. When the selector 41 finishes selection p times, the drive/measurement signal generation circuit 17 stores (m/2) digital values each representing the difference between the result of the main measurement and the result of the dummy measurement. The drive/measurement signal generation circuit 17 outputs the monitor signal MS including the (m/2) digital values to the display control circuit 12.

In order to correct the video signal VS1 to obtain the video signal VS2, the data line drive/current measurement circuit 14 measures four kinds of currents with respect to each pixel circuit 20. More specifically, in order to obtain characteristics of the transistor 21 in each pixel circuit 20, the data line drive/current measurement circuit 14 measures a current Im1 flowing out from the pixel circuit 20 when a first measurement voltage Vm1 is written to the pixel circuit 20, and a current Im2 flowing out from the pixel circuit 20 when a second measurement voltage Vm2 (>Vm1) is written to the pixel circuit 20. Furthermore, in order to obtain characteristics of the organic EL element 24 in each pixel circuit 20, the data line drive/current measurement circuit 14 measures a current Im3 flowing into the pixel circuit 20 when a third measurement voltage Vm3 is written to the pixel circuit 20, and a current Im4 flowing into the pixel circuit 20 when a fourth measurement voltage Vm4 (>Vm3) is written to the pixel circuit 20. Hereinafter, measuring the currents Im1, Im2 is referred to as "detecting characteristics of the drive transistor", and measuring the currents Im3, Im4 is referred to as "detecting characteristics of the organic EL element".

The scanning line drive circuit 13 and the data line drive/current measurement circuit 14 perform a processing for writing to the pixel circuits 20 in one row and a processing for measuring one of four kinds of the currents Im1 to Im4 with respect to the pixel circuits 20 in a half row. For example, in eight consecutive frame periods, the scanning line drive circuit 13 and the data line drive/current measurement circuit 14 may measure the currents Im1 to Im4 with respect to a half of the pixel circuits 20 in the i-th row in an i-th line period in the first, third, fifth, and seventh frame periods, respectively, may measure the currents Im1 to Im4 with respect to the remaining half of the pixel circuits 20 in the i-th row in the i-th line period in the second, fourth, sixth, and eighth frame periods, respectively, and may perform a processing for writing to the pixel circuits 20 in one row in other line periods.

FIG. 4 is a timing chart of the main measurement when detecting the characteristics of the drive transistor. FIG. 5 is a timing chart of the main measurement when detecting the characteristics of the organic EL element. In FIGS. 4 and 5, a period t0 is included in a selection period when writing to the pixel circuits 20 in an (i−1)-th row, and periods t1 to t6 are included in a selection period when measuring current with respect to the pixel circuits 20 in the i-th row. The selection period when measuring the current includes a reset period t1, a reference voltage write period t2, a measurement voltage write period t3, a current measurement period t4, an A/D conversion period t5, and a data voltage write period t6. Hereinafter, signals on the scanning lines GAi, GBi are referred to as scanning signals GAi, GBi, and a voltage of an output signal of the D/A converter corresponding to the data line Sj is referred to as DVj. The timing chart for the dummy measurement is obtained based on FIGS. 4 and 5 by setting the voltage DVj in the periods t3 to t5 to the zero voltage.

Before the period t1, the scanning signals GAi, GBi and the switch control signal CLK2B are in a low level, and the switch control signals CLK1, CLK2 are in a high level. In the period t0, the scanning signal GAi-1 (not shown) becomes the high level, the scanning signal GBi-1 (not shown) becomes the low level, and the voltage DVj becomes a data voltage Vdata(i−1,j) to be written to the pixel circuit 20 in the (i−1)-th row and the j-th column.

In the period t1, the scanning signals GAi, GBi become the high level, and the voltage DVj becomes a pre charge voltage Vpc. The pre charge voltage Vpc is determined so that the transistor 21 turns off. Especially, it is desirable that the precharge voltage Vpc be determined as high as possible in a range where both a drive transistor (transistor 21) and the organic EL element 24 turn off (the reason will be described later). In the period t1, in the pixel circuits 20 in the i-th row, the transistors 22, 23 turn on, and the precharge voltage Vpc is applied to the gate terminal and the source terminal of the transistor 21 and the anode terminal of the organic EL element 24. With this, the transistor 21 and the organic EL element 24 in the pixel circuits 20 in the i-th row are initialized.

For example, when the transistor 21 is formed using a semiconductor oxide such as an InGaZnO (Indium Gallium Zinc Oxide), the transistor 21 may have hysteresis characteristics. If the transistor 21 is used without an initialization in this case, a current measurement result may vary depending on a previous display status. By providing the reset period t1 at the start of the selection period when measuring current and initializing the transistor 21 in the reset, period t1, variation of the current measurement result due to the hysteresis characteristics can be prevented. Note that since the organic EL element 24 does not have the hysteresis characteristics, it is not necessary to provide the reset period t1 when detecting the characteristics of the organic EL element. Furthermore, when the current is measured not when displaying but in a non-display state just after power on or during display off, the reset period may be omitted.

In the period t2, the scanning signal GAi becomes the high level, the scanning signal GBi becomes the low level, and the voltage DVj becomes a reference voltage (Vref_TFT when detecting the characteristics of the drive transistor, Vref_OLED when detecting characteristics of the organic EL element). In the period t2, in the pixel circuit 20 in the i-th row and the j-th column, the transistor 22 turns on, the transistor 23 turns off, and the reference voltage Vref_TFT or Vref_OLED is applied to the gate terminal of the transistor 21. The reference voltage Vref_TFT is determined to be a high voltage so that the transistor 21 turns on in the periods t3, t4. The reference voltage Vref_OLED is determined to be a low voltage so that the transistor 21 turns off in the periods t3, t4.

In the period t3, the scanning signal GAi becomes the low level, the scanning signal GBi becomes the high level, and the voltage DVj becomes one of the first to fourth measurement voltages Vm1 to Vm4. Vm_TFT shown in FIG. 4 represents one of the first and second measurement voltages Vm1, Vm2, and Vm_OLED shown in FIG. 5 represents one of the third and fourth measurement voltages Vm3, Vm4. In the period t3, in the pixel circuit 20 in the i-th row and the j-th column, the transistor 22 turns off, the transistor 23 turns on, and one or the first to fourth measurement voltages Vm1 to Vm4 is applied to the anode terminal of the organic EL element 24. When detecting the characteristics of the drive transistor, the transistor 21 turns on, and a current flows from the power supply line or the power supply electrode having the high-level power supply voltage ELVDD via the transistors 21, 23 to the data line Sj. When detecting the characteristics of the organic EL element, the transistor 21 turns off, and a current flows from the data line Sj via the transistor 23 and the organic EL element 24 to the power supply line or the power supply electrode having the low-level power supply voltage ELVSS. When some time passes after the start of the period t3, the data line Sj is charged to a predetermined voltage level, and a current flowing out from the pixel circuit 20 to the data line Sj (or a current flowing from the data line Sj into the pixel circuit 20) becomes constant.

Note that in a case where a source potential of the transistor 21 in the period t2 is low when detecting the characteristics of the drive transistor, a gate-source voltage of the transistor 21 becomes large at the start of the period t3, a large current flows through the transistor 21, and the organic EL element 24 emits light. In order to prevent emitting light at this time, as described above, the precharge voltage Vpc applied in the period t1 is determined to be high in a range where both the drive transistor and the organic EL element 24 turn off.

In the period t4, the scanning signals GAi, GBi and the voltage DVj keep the same level as in the period t3, and the switch control signal CLK1 becomes the low level. In the period t4, the switch 33 turns off, and the output terminal and the inverting input terminal of the operational amplifier 31 are connected via the capacitor 32. At this time, the operational amplifier 31 and the capacitor 32 function as an integration amplifier. An output voltage of the operational amplifier 31 at the end of the period t4 is determined by an amount of the current flowing through the pixel circuit 20 in the i-th row and the j-th column and the data line Sj, a capacitance of the capacitor 32, a length of the period t4, and the like.

In the period t5, the scanning signals GAi, GBi and the switch control signals CLK1, CLK2 become the low level, the switch control signal CLK2B becomes the high level, and the voltage DVj keeps the same level as in the periods t3, t4. In the period t5, in the pixel circuit 20 in the i-th row and the j-th column, the transistors 22, 23 turn off. Since the switch 34 turns off and the switch 35 turns on, the data line Sj is electrically disconnected from the non-inverting input terminal of the operational amplifier 31, and the voltage V0 is applied to the data line Sj. Since the non-inverting input terminal of the operational amplifier 31 is electrically disconnected from the data line Sj, an output voltage of the operational amplifier 31 becomes constant. In the period t5, the offset circuit 42 corresponding to a group including the data line Sj adds the offset to the output voltage of the operational amplifier 31, and the A/D converter 43 corresponding to the group converts an analog signal after adding the offset to a digital value (refer to FIG. 3).

In the period t6, the scanning signal GAi becomes the high level, the scanning signal GBi becomes the low level, and the voltage DVj becomes a data voltage Vdata (i,j) to be written to the pixel circuit 20 in the i-th row and the j-th column. In the period t6, in the pixel circuit 20 in the i-th row and the j-th column, the transistor 22 turns on, and the data voltage Vdata(i,j) is applied to the gate terminal of the transistor 21. When the scanning signal GAi changes to the low level at the end of the period t6, the transistor 22 in the pixel circuit 20 in the i-th row and the j-th column turns off. After that, in the pixel circuit 20 in the i-th row and the j-th column, the gate voltage of the transistor 21 is kept at Vdata (i,j) by the action of the capacitor 25.

The correction unit 16 performs a processing for obtaining the characteristics of the transistor 21 and the organic EL element 24 based on the measured four kinds of the currents Im1 to Im4, and corrects the video signal VS1 based on the obtained two kinds of characteristics. More specifically, the correction unit 16 obtains the threshold voltage and the gain as the characteristics of the transistor 21 based on the two kinds of currents Im1, Im2. The threshold voltage of the transistor 21 is written to the TFT offset storing unit 15a, and the gain of the transistor 21 is written to the TFT gain storing unit 15b. Furthermore, the correction unit 16 obtains the threshold voltage and the gain as the characteristics of the organic EL element 24 based on the two kinds of currents Im3, Im4. The threshold voltage of the organic EL element 24 is written to the OLED offset storing unit 15c, and the gain of the organic EL element 24 is written to the OLED gain storing unit 15d. The correction unit 16 reads the threshold voltage and the gain from the correction data storing unit 15, and corrects the video signal VS1 using these values.

Hereinafter, gate-source voltages of the transistor 21 when the first and second measurement voltages Vm1, Vm2 are written to the pixel circuit 20 are denoted by Vgsm1, Vgsm2, respectively, and anode-cathode voltages of the organic EL element 24 when the third and fourth measurement voltages Vm3, Vm4 are written to the pixel circuit 20 are denoted by Vom3, Vom4, respectively.

When the correction unit 16 receives the monitor signal MS including the currents Im1, Im2, the correction unit 16 obtains the threshold voltage $Vth_{TFT}$ and the gain $\beta_{TFT}$ of the transistor 21 by performing a calculation shown in the following equations (1a), (1b) on the voltages Vgsm1, Vgsm2 and the currents Im1, Im2.

$$Vth_{TFT} = \frac{Vgsm1\sqrt{Im2} - Vgsm2\sqrt{Im1}}{\sqrt{Im2} - \sqrt{Im1}} \quad (1a)$$

$$\beta_{TFT} = \frac{2(\sqrt{Im2} - \sqrt{Im1})^2}{(Vgsm2 - Vgsm1)^2} \quad (1b)$$

The threshold voltage $Vth_{TFT}$ is written to the TFT offset storing unit 15a, and the gain $\beta_{TFT}$ is written to the TFT gain storing unit 15b.

When the correction unit 16 receives the monitor signal MS including the currents Im3, Im4, the correction unit 16 obtains the threshold voltage $Vth_{OLED}$ and the gain $\beta_{OLED}$ of the organic EL element 24 by performing a calculation shown in the following equations (2a), (2b) on the voltages Vom3, Vom4 and the currents Im3, Im4.

$$Vth_{OLED} = \frac{Vom3\sqrt[K]{Im4} - Vom4\sqrt[K]{Im3}}{\sqrt[K]{Im4} - \sqrt[K]{Im3}} \quad (2a)$$

$$\beta_{OLED} = \frac{(\sqrt[K]{Im4} - \sqrt[K]{Im3})^K}{(Vom4 - Vom3)^K} \quad (2b)$$

In the equations (2a), (2b), K is a constant not less than 2 and not more than 3. The threshold voltage $Vth_{OLED}$ is written to the OLED offset storing unit 15c, and the gain $\beta_{OLED}$ is written to the OLED gain storing unit 15d.

FIG. 6 is a flowchart of a correction processing on the video signal VS1. The correction unit 16 corrects a code value CV0 included in the video signal VS1, using the threshold voltage $Vth_{TFT}$ of the transistor 21, the gain $\beta_{TFT}$ of the transistor 21, the threshold voltage $Vth_{OLED}$ of the organic EL element 24, and the gain $\beta_{OLED}$ of the organic EL element 24. The threshold voltages $Vth_{TFT}$, $Vth_{OLED}$ and the gains $\beta_{TFT}$, $\beta_{OLED}$ used in the following processing are read from the correction data storing unit 15.

First, the correction unit 16 performs a processing for correcting a light emission efficiency of the organic EL element 24 (step S101). Specifically, the correction unit 16 obtains a corrected code value CV1 by performing a calculation shown in the following equation (3).

$$CV1=CV0\times\gamma \quad (3)$$

In the equation (3), γ represents a light emission efficiency correction coefficient determined with respect to each pixel circuit 20. The light emission efficiency correction coefficient γ has a larger value, as the light emission efficiency of the organic EL element 24 in a pixel degrades more. Note that γ may be obtained by a calculation.

Next, the correction unit 16 converts the corrected code value CV1 to a voltage value $Vdata1_{TFT}$ representing the gate-source voltage of the transistor 21 and a voltage value $Vdata1_{OLED}$ representing the anode-cathode voltage of the organic EL element 24 (step S102). Conversion in step S102 is performed, for example, by a method of referring to a table prepared in advance or a method of calculating using a calculation unit.

Next, the correction unit 16 obtains a corrected voltage value $Vdata2_{TFT}$ by performing a calculation shown in the following equation (4) on the voltage value $Vdata1_{TFT}$ (step S103).

$$Vdata2_{TFT}=Vdata1_{TFT}\times B_{TFT}+Vth_{TFT} \quad (4)$$

When an average value of an initial value of the gain of the transistor 21 is denoted by $\beta 0_{TFT}$, $B_{TFT}$ included in the equation (4) is given by the following equation (5).

$$B_{TFT} = \sqrt{(\beta 0_{TFT}/\beta_{TFT})} \quad (5)$$

Next, the correction unit 16 obtains a corrected voltage value Vdata$2_{OLED}$ by performing a calculation shown in the following equation (6) on the voltage value Vdata$1_{OLED}$ (step S104).

$$V\text{data}2_{OLED} = V\text{data}1_{OLED} \times B_{OLED} + V\text{th}_{OLED} \quad (6)$$

When an average value of an initial value of the gain of the organic EL element 24 is denoted by $\beta 0_{OLED}$, $B_{OLED}$ included in the equation (6) is given by the following equation (7).

$$B_{OLED} = (\beta 0_{OLED}/\beta_{OLED})^{1/K} \quad (7)$$

Next, the correction unit 16 adds the corrected voltage value Vdata$2_{TFT}$ obtained in step S103 to the corrected voltage value Vdata$2_{OLED}$ obtained in step S104 in accordance with the following equation (8). With this, the voltage value Vdata representing a voltage to be applied to the gate terminal of the transistor 21 is obtained (step S105).

$$V\text{data} = V\text{data}2_{TFT} + V\text{data}2_{OLED} \quad (8)$$

Finally, the correction unit 16 converts the voltage value Vdata to an output code value CV (step S106). Conversion in step S106 is performed in a manner similar to that in step S102.

FIG. 7 is a diagram showing a correspondence between the output/measurement circuit 30 and the selector 41, and a switching method between the main measurement and the dummy measurement in the display device 10. Hereinafter, the output/measurement circuit 30 corresponding to the data line Sj is referred to as j-th output/measurement circuit. As shown in FIGS. 3 and 7, p pieces of the output/measurement circuits 30 are corresponded to each selector 41 sequentially. For example, first to p-th output/measurement circuits 30 are corresponded to a first selector 41, and (p+1)-th to 2p-th output/measurement circuits 30 are corresponded to a second selector 41. The m output/measurement circuits 30 are classified into two groups alternately, p pieces at a time, in accordance with an alignment order of the corresponding data lines. First to p-th, (2p+1)-th to 3p-th, . . . output/measurement circuits 30 are classified as a first group, and (p+1)-th to 2p-th, (3p+1)-th to 4p-th, . . . output/measurement circuits 30 are classified as a second group. Similarly, the (m×n) pixel circuits 20 are classified into two groups alternately, p columns at a time. The pixel circuits 20 in the first to p-th columns, (2p+1)-th to 3p-th columns, . . . are classified as a first group, and the pixel circuits 20 in (p+1)-th to 2p-th columns, (3p+1)-th to 4p-th columns, . . . are classified as a second group.

When measuring the current with respect to the pixel circuits 20 in the first group, the data line drive/current measurement circuit 14 performs the main measurement using the output/measurement circuits 30 in the first group and the dummy measurement using the output/measurement circuits 30 in the second group at a same timing, and performs a calculation for obtaining a difference between a result of the main measurement and a result of the dummy measurement. Furthermore, when measuring the current with respect to the pixel circuits 20 in the second group, the data line drive/current measurement circuit 14 performs the main measurement using the output/measurement circuits 30 in the second group and the dummy measurement using the output/measurement circuits 30 in the first group at a same timing, and performs the calculation for obtaining the difference between the result of the main measurement and the result of the dummy measurement.

Specifically, in a selection period when measuring the current with respect to the pixel circuits 20 in the i-th row, the selection period being set in a frame period, the data line drive/current measurement circuit 14 supplies the measurement voltage to first to p-th, (2p+1)-th to 3p-th, . . . output/measurement circuits 30 and performs the main measurement with respect to the pixel circuits 20 in first to p-th, (2p+1)-th to 3p-th, . . . columns. Concurrently, the data line drive/current measurement circuit 14 supplies the zero voltage to (p+1)-th to 2p-th, (3p+1)-th to 4p-th, . . . output/measurement circuits 30 and performs the dummy measurement with respect the pixel circuits 20 in (p+1)-th to 2p-th, (3p+1)-th to 4p-th, . . . columns (refer to upper part of FIG. 7). Furthermore, in a selection period when measuring the current with respect to the pixel circuits 20 in the i-th row, the selection period being set in another frame period, the data line drive/current measurement circuit 14 supplies the measurement voltage to the (p+1)-th to 2p-th, (3p+1)-th to 4p-th, . . . output/measurement circuits 30 and performs the main measurement with respect to the pixel circuits 20 in the (p+1)-th to 2p-th, (3p+1)-th to 4p-th, . . . columns. Concurrently, the data line drive/current measurement circuit 14 supplies the zero voltage to the first to the p-th, (2p+1)-th 3p-th, . . . output/measurement circuits 30, and performs the dummy measurement with respect to the pixel circuits 20 in the first to p-th, (2p+1)-th to 3p-th, . . . columns (refer to lower part of FIG. 7). In both cases, the main measurement and the dummy measurement are performed at a same timing.

Each selector 41 selects the output signals of the p output/measurement circuits 30 in an ascending order, for example. The drive/measurement signal generation circuit 17 obtains a difference between a digital value based on an output signal of a k-th selector 41 (here, k is an odd number not less than 1 and not more than (m/p)) and a digital value based on an output signal of a (k+1)-th selector 41, and stores the difference temporarily. With this, it is possible to obtain the difference between the result of the main measurement using the output/measurement circuit 30 in the first group and the result of the dummy measurement using the output/measurement circuit 30 in the second group, or the difference between the result of the main measurement using the output/measurement circuits 30 in the second group and the result of the dummy measurement using the output/measurement circuit 30 in the first group.

For example, when the first to p-th output/measurement circuits 30 perform the main measurement, and the (p+1)-th to 2p-th output/measurement circuits 30 perform the dummy measurement, the first selector 41 sequentially selects an output signal of the first output/measurement circuit 30, an output signal of the second output/measurement circuit 30, . . . and an output signal of the p-th output/measurement circuit 30. In accordance with this, the second selector 41 sequentially selects an output signal of the (p+1)-th output/measurement circuit 30, an output signal of the (p+2)-th output/measurement circuit 30, . . . , and an output signal of the 2p-th output/measurement circuit 30. The drive/measurement signal generation circuit 17 sequentially obtains a difference between the output signal of the first output/measurement circuit 30 and the output signal of the (p+1)-th output/measurement circuit 30, a difference between the output signal of the second output/measurement circuit 30 and the output signal of the (p+2)-th output/measurement circuit 30, . . . , and a difference between the output signal of the p-th output/measurement circuit 30 and the output signal of the 2p-th output/measurement circuit 30. With this, it is possible to obtain a difference between a result of the main measurement using the first output/measurement circuit 30 and a result of the dummy measurement using the (p+1)-th output/measurement circuit 30, a difference between a result of the main measurement using the second output/measurement circuit 30 and a result of the dummy measurement using the (p+2)-th output/measurement circuit 30, . . . , and a difference between a result of the main measurement using the p-th output/measurement circuit 30 and a result of the dummy measurement using the 2p-th output/measurement circuit 30.

The result of the dummy measurement can be regarded as noise occurring in a circuit system which measures the current flowing through the pixel circuit 20. Since the result of the main measurement includes the above-described noise, it is possible to measure the current flowing through the pixel circuit 20 without including the noise, by obtaining the difference between the result of the main measurement and the result of the dummy measurement. A difference between a result of the main measurement with respect to the pixel circuit 20 in the i-th row and the j-th column and a result of the dummy measurement with respect to the pixel circuit 20 in the i-th row and a (j+p)-th column represents a result of measuring the current flowing through the pixel circuit 20 in the i-th row and the j-th column, the current being measured without including the noise. A difference between a result of the main measurement with respect to the pixel circuit 20 in the i-th row and the (j+p)-th column and a result of the dummy measurement with respect to the pixel circuit 20 in the i-th row and the j-th column represents a result of measuring the current flowing through the pixel circuit 20 in the i-th row and the (j+p)-th column, the current being measured without including the noise. The data line drive/current measurement circuit 14 measures the current flowing through the pixel circuit 20 by the above-described method.

Effects of the display device 10 according to the present embodiment will be described below. In an organic EL display which measures a current flowing through a pixel circuit and corrects a video signal based on a current measurement result, noise is imposed on the current measurement result, and high image quality display can not be performed being affected by the noise. For example, fluctuation of an output of a D/A converter supplied to a current measurement circuit, and noise included in a power supply voltage supplied to an operational amplifier in the current measurement circuit are generating factors of large noise. Power supply ripple, load regulation, low frequency noise of a commercial power supply, snake noise from an internal circuit, and the like are also reasons for generating noise. Furthermore, in a case where the output/measurement circuit 30 shown in FIG. 2 is used, a gain of the output/measurement circuit 30 becomes extremely large (equals to an open loop gain) when the switch control signal CLK1 is in the low level. Thus, the output/measurement circuit 30 amplifies small noise largely when the switch control signal CLK1 is in the low level.

The display device 10 according to the present embodiment measures the current flowing through the pixel circuit 20 by performing the main measurement and the dummy measurement at the same timing, and performing the calculation for obtaining the difference between the result of the main measurement and the result of the dummy measurement. When various kinds of noises occur in the display device 10, noises approximately equal in quantity are imposed on the result of the main measurement and the result of the dummy measurement. Thus, it is possible to remove the noise in the current measurement and correctly measure the current flowing through the pixel circuit 20, by obtaining the difference between the result of the main measurement and the result of the dummy measurement. Therefore, it is possible to remove the noise in the current measurement and perform high image quality display, by correcting the video signal VS1 based on the current measurement result.

In the above description, the selector 41 selects the output signals of the p output/measurement circuits 30 in the ascending order. Alternatively, the selector 41 may select the output signals of the p output/measurement circuits 30 in an order of first, p-th, second, (p−1)-th, third, (p−2)-th, . . . . Alternatively, odd-numbered selectors 41 may select the output signals of the p output/measurement circuits in a descending order, and even-numbered selectors 41 may select the output signals of the p output/measurement circuits 30 in the ascending order. With this, it is possible to reduce a difference between timings for performing A/D conversion of the output signals of the adjacent output/measurement circuits 30, and effectively remove the noise in the current measurement.

As described above, the display device 10 according to the present embodiment has the display unit 11 including a plurality of the scanning lines GA1 to GAn, GB1 to GBn, a plurality of the data lines S1 to Sm, a plurality of the pixel circuits 20 arranged two-dimensionally, the scanning line drive circuit 13 for driving the scanning lines GA1 to GAn, GB1 to GBn, a data line drive circuit (part of the data line drive/current measurement circuit 14) for driving the data lines S1 to Sm, and a current measurement circuit (another part of the data line drive/current measurement circuit 14) including a plurality of measurement units (output/measurement circuits 30) and for measuring a current flowing through the pixel circuit 20. The current measurement circuit performs, at a same timing, the main measurement for measuring a current with respect to the pixel circuit 20 with supplying a measurement signal (measurement voltage) to a part of the measurement units and the dummy measurement for measuring a current with supplying a dummy signal (zero voltage) to the remaining measurement units, and performs a calculation on a result of the main measurement and a result of the dummy measurement. It is enough that at least a part of the remaining measurement units perform the dummy measurement. It is possible to remove the noise in measurement when measuring the current with respect to the pixel circuit 20, by performing the main measurement and the dummy measurement, at the same timing and performing the calculation on the result of the main measurement and the result of the dummy measurement. Furthermore, high image quality display can be performed using the current measurement result.

Furthermore, the current measurement circuit supplies, as the dummy signal, a signal (zero voltage) with which a value to be measured is approximately zero when performing the dummy measurement, and obtains the difference between the result of the main measurement and the result of the dummy measurement. With this, the noise in measurement when measuring the current with respect to the pixel circuit 20 can be removed easily.

Furthermore, the measurement unit is provided corresponding to the data line Sj, and the current measurement circuit measures the current with respect to the pixel circuit with supplying the dummy signal to the remaining measurement units. With this, the noise in measurement when measuring the current with respect to the pixel circuit 20 can be removed without providing a new circuit for the dummy measurement. Furthermore, the measurement units are classified into the first and second groups, the current measurement circuit performs the main measurement using the measurement unit in the first group and the dummy measurement using the measurement unit in the second group at a same timing in a first period, and performs the main measurement using the measurement unit in the second group and the dummy measurement using the measurement unit in the first group at a same timing in a second period. It is possible to measure the current flowing through the pixel circuits 20 having the same number (m) as that of the data lines S1 to Sm through two main measurements, by dividing the measurement units into two groups and performing the main measurement and the dummy measurement alternately.

Furthermore, the measurement units are classified into the first and second groups alternately, two or more (p) at a time, in accordance with an alignment order of the corresponding data lines. Therefore, when measuring the current with respect to the pixel circuit 20, the noise in the current measurement can be removed effectively by referring to the result of the dummy measurement of a neighboring pixel circuit 20. Furthermore, the current measurement circuit includes a selector (odd-numbered selector 41) for selecting outputs of the measurement units in the first group, and a selector (even-numbered selector 41) for selecting outputs of the measurement units in the second group. Therefore, it is possible to select the result of the main measurement and the result of the dummy measurement using the selectors 41, and perform the calculation on the two selected measurement results.

Furthermore, the display device 10 includes the correction unit 16 for correcting the video signal VS1 to be supplied to the data line drive circuit, based on the current measured by the current measurement circuit. Therefore, high image quality display can be performed by correcting the video signal VS1 based on the measured current.

Furthermore, the pixel circuit 20 includes an electro-optical element (organic EL element 24), a drive transistor (transistor 21) connected in series with the electro-optical element, a write control transistor (transistor 22) having a first conduction terminal connected to the data line Sj, a second conduction terminal connected to a control terminal (gate terminal) of the drive transistor, and a control terminal connected to a first scanning line GAi in the scanning lines, and a read control transistor (transistor 23) having a first conduction terminal connected to the data line Sj, a second conduction terminal connected to a connection point of the drive transistor and the electro-optical element, and a control terminal connected to a second scanning line GBi in the scanning lines. Therefore, in the display device having the pixel circuit including the electro-optical element, the drive transistor, the write control transistor, and the read control transistor, the noise in measurement when measuring the current with respect to the pixel circuit can be removed.

Furthermore, the display device 10 includes a storing unit (correction data storing unit 15) for storing the threshold voltage and the gain of the electro-optical element and the drive transistor for each pixel circuit. The correction unit 16 obtains the threshold voltage and the gain to be stored in the storing unit based on the current measured by the current measurement circuit, and corrects the video signal VS1 based on the threshold voltage and the gain stored in the storing unit. Therefore, it is possible to compensate for variation and fluctuation of the characteristics of the electro-optical element and the drive transistor and perform high image quality display, by obtaining the threshold voltage and the gain of the electro-optical element and the drive transistor based on the current measurement result and correcting the video signal VS1 using these values. Furthermore, the data line drive circuit and the current measurement circuit snare an amplifier (operational amplifier 31). With this, a circuit amount of the display device 10 can be reduced.

Second Embodiment

A display device according to a second embodiment of the present invention has a configuration similar to that of the display device according to the first embodiment (refer to FIGS. 1 and 2), and displays images using three basic colors of red, green, and blue. Each of the (m×n) pixel circuits 20 has a display color selected from among red, green, and blue for each corresponding data line (in other words, for each column). The display color of the pixel circuits 20 in first, fourth, seventh, . . . columns is red, the display color of the pixel circuits 20 in second, fifth, eighth, . . . columns is green, and the display color of the pixel circuits 20 in third, sixth, ninth, . . . columns is blue.

FIG. 8 is a diagram showing a correspondence between the output/measurement circuit 30 and the selector 41, and a switching method between the main measurement and the dummy measurement in the display device according to the present embodiment. FIG. 8 is obtained by setting p=3 in FIG. 7. The output/measurement circuits 30 are classified into the first and second groups alternately, three at a time, in accordance with an alignment order of the corresponding data lines. The data line drive/current measurement circuit 14 performs, at a same timing, the main measurement and the dummy measurement with respect to the pixel circuits 20 having the same display color.

As described above, in the display device according to the present embodiment, the pixel circuit 20 has one of a plurality of display colors for each corresponding data line. The measurement units (output/measurement circuits 30) are classified into the first and second groups alternately, the same number (three) as that of the display colors at a time, in accordance with the alignment order of the corresponding data lines. The noise in the current measurement can be removed effectively, by performing the main measurement and the dummy measurement with respect to the pixel circuits 20 having the same display color.

Third Embodiment

A display device according to a third embodiment of the present invention has a configuration similar to that of the display device according to the first embodiment (refer to FIGS. 1 and 2). A correspondence between the output/measurement circuit 30 and the selector 41, and a switching method between the main measurement and the dummy measurement are different between the present embodiment and the first embodiment. Differences from the first embodiment will be described below.

FIG. 9 is a diagram showing a correspondence between the output/measurement circuit 30 and the selector 41, and a switching method between the main measurement and the dummy measurement in the display device according to the present embodiment. In the present embodiment, odd-numbered output/measurement circuits 30 are sequentially corresponded to odd-numbered selectors 41, p circuits at a time, and even-numbered output/measurement circuits 30 are sequentially corresponded to even-numbered selectors 41, p circuits at a time. For example, first, third, . . . , and (2p−1)-th output/measurement circuits 30 are corresponded to the first selector 41, and second, fourth, . . . , and 2p-th output/measurement circuits 30 are corresponded to the second selector 41. The m output/measurement circuits 30 are classified into two groups alternately, one at a time, in accordance with an alignment order of the corresponding data lines. The odd-numbered output/measurement circuits 30 are classified as the first group, and the even-numbered output/measurement circuits 30 are classified as the second group. Similarly, the (m×n) pixel circuits 20 are classified into two groups alternately for each column. The pixel circuits 20 in odd-numbered columns are classified as first group, and the pixel circuits 20 in even-numbered columns are classified as second group.

When measuring the current with respect to the pixel circuit 20 in the first group (pixel circuit 20 in the odd-numbered column), the data line drive/current measurement circuit 14 performs, at a same timing, the main measurement using the output/measurement circuit 30 in the first group (odd-numbered output/measurement circuit 30) and the dummy measurement using the output/measurement circuit 30 in the second group (even-numbered output/measurement circuit 30), and obtains the difference between the result of the main measurement and the result of the dummy measurement. When measuring the current with respect to the pixel circuit 20 in the second group (pixel circuit 20 in the even-numbered column), the data line drive/current measurement circuit 14 performs, at a same timing, the main measurement using the output/measurement circuit 30 in the second group and the dummy measurement using the output/measurement circuit 30 in the first group, and obtains the difference between the result of the main measurement and the result of the dummy measurement.

Specifically, in a selection period when measuring the current with respect to the pixel circuits 20 in the i-th row, the selection period being set in a frame period, the data line drive/current measurement circuit 14 supplies the measurement voltage to first, third, . . . output/measurement circuits 30 and performs the main measurement with respect to the pixel circuits 20 in first, third, . . . columns. Concurrently, the data line drive/current measurement circuit 14 supplies the zero voltage to second, fourth, . . . output/measurement circuits 30 and performs the dummy measurement with respect to the pixel circuits 20 in second, fourth, . . . columns (refer to upper part of FIG. 8). Furthermore, in a selection period when measuring the current with respect to the pixel circuits in the i-th row, the selection period being set in another frame period, the data line drive/current measurement circuit 14 supplies the measurement voltage to the second, fourth, . . . output/measurement circuits 30 and performs the main measurement with respect to the pixel circuits 20 in the second, fourth, . . . columns. Concurrently, the data line drive/current measurement circuit 14 supplies the zero voltage to the first, third, . . . output/measurement circuits 30 and performs the dummy measurement with respect to the pixel circuits 20 in the first, third, . . . columns (refer to lower part of FIG. 8). In both cases, the main measurement and the dummy measurement are performed at the same timing.

Each selector 41 selects output signals of the p output/measurement circuits 30 in an ascending order, for example. The drive/measurement signal generation circuit 17 obtains a difference between a digital value based on an output signal of a k-th selector 41 (here, k is an odd number not less than 1 and not more than (m/p)) and a digital value based on an output signal of a (k+1)-th selector 41, and stores the difference temporarily. With this, it is possible to obtain the difference between the result of the main measurement using the odd-numbered output/measurement circuit 30 and the result of the dummy measurement using the even-numbered output/measurement circuit 30, or the difference between the result of the main measurement using the even-numbered output/measurement circuit 30 and the result of the dummy measurement using the odd-numbered output/measurement circuit 30. A difference between a result of the main measurement with respect to the pixel circuit 20 in the i-th row and the j-th column and a result of the dummy measurement with respect to the pixel circuit 20 in the i-th row and a (j+1)-th column represents a result of measuring the current flowing through the pixel circuit 20 in the i-th row and the j-th column. A difference between a result of the main measurement with respect to the pixel circuit 20 in the i-th row and the (j+1)-th column and a result of the dummy measurement with respect to the pixel circuit 20 in the i-th row and the j-th column represents a result of measuring the current flowing through the pixel circuit 20 in the i-th row and the (j+1)-th column. The data line drive/current measurement circuit 14 measures the current flowing through the pixel circuit 20 by the above-described method.

As described above, in the display device according to the present embodiment, the measurement units (output/measurement circuits 30) are classified into the first and second groups alternately, one at a time, in accordance with an alignment order of the corresponding data lines. Therefore, when measuring the current flowing through the pixel circuit 20, the noise in the current measurement can be removed effectively, by referring to the result of the dummy measurement with respect to an adjacent pixel circuit 20.

Fourth Embodiment

A display device according to a fourth embodiment of the present invention has a configuration similar to that of the display device according to the first embodiment (refer to FIGS. 1 and 2). However, the display device according to the present embodiment includes a data line drive/current measurement circuit 50 shown in FIG. 10, in place of the data line drive/current measurement circuit 14 shown in FIG. 3.

Figure 10:
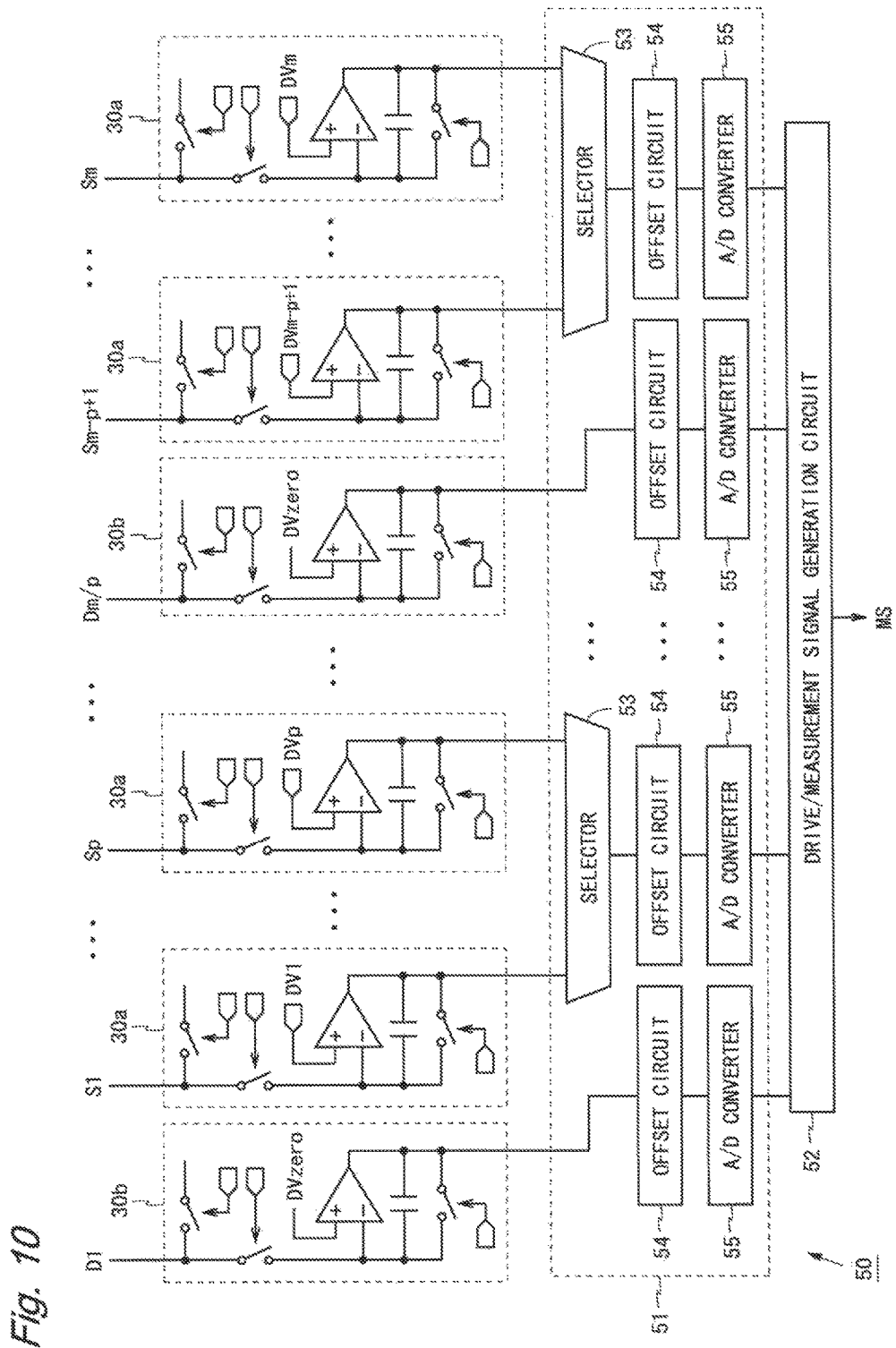
FIG. 10 is a diagram showing a part of a data line drive/current measurement circuit of a display device according to a fourth embodiment of the present invention in detail.

The data line drive/current measurement circuit 50 shown in FIG. 10 includes (m+ m/p) pieces of the output/measurement circuits 30, a signal conversion circuit 51, and a drive/measurement signal generation circuit 52. The signal conversion circuit 51 includes (m/p) selectors 53, (2m/p) offset circuits 54, and (2m/p) A/D converters 55.

The (m+m/p) output/measurement circuits 30 are classified into m main measurement circuits (hereinafter referred to as output/measurement circuits 30a) and (m/p) dummy measurement circuits (hereinafter referred to as output/measurement circuit 30b). The m output/measurement circuits 30a are connected to the m data lines S1 to Sm, respectively. The output signal DVj of the D/A converter (not shown) corresponding to the data line Sj is applied to the non-inverting input terminal of the operational amplifier 31 in the output/measurement circuit 30a connected to the data line Sj. The m output/measurement circuits 30a and the (m/p) selectors 53 are connected in the same manner as the first embodiment.

The (m/p) output/measurement circuits 30b are respectively connected to (m/p) dummy wirings D1 to Dm/p formed in the display unit 11. Each of the dummy wirings D1 to Dm/p has a same load as those of the data lines S1 to Sm, and functions as a dummy measurement target circuit.

The zero voltage DVzero is fixedly applied to the non-inverting input terminal of the operational amplifier 31 in the output/measurement circuit 30b.

The selector 53 selects one analog signal from among output signals of the p output/measurement circuits 30a. The offset circuit 54 adds a predetermined offset to the analog signal selected by the selector 53 or an output signal of the output/measurement circuit 30b. The A/D converter 55 converts an analog signal output from the offset circuit 54 to a digital value.

The drive/measurement signal generation circuit 52 obtains a difference between the result of the main measurement and the result of the dummy measurement based on a digital value obtained by each A/D converter 55, and stores the difference temporarily. The selector 53 sequentially selects output signals of the p output/measurement circuits 30a. When the selector 53 finishes selection p times, the drive/measurement signal generation circuit 52 stores m digital values each representing the difference between the result of the main measurement and the result of the dummy measurement. The drive/measurement signal generation circuit 52 outputs the monitor signal MS including the m digital values to the display FIG. 11 is a diagram showing timings of the main measurement and the dummy measurement in the display device according to the present embodiment. FIG. 11 depicts a timing of the main measurement by the output/measurement circuits 30a connected to the data lines S1 to Sp and a timing of the dummy measurement by the output/measurement circuit 30b connected to the dummy wiring D1. Here, each of the main measurement and the dummy measurement is divided into measurement and A/D conversion.

As shown in FIG. 11, at time t0, measurement by the output/measurement circuit 30b connected to the dummy wiring D1 and measurement by the output/measurement circuits 30a connected to the data lines S1 to Sp are performed at a same timing. At time t1, A/D conversion of an output signal of the output/measurement circuit 30b connected to the dummy wiring D1 and A/D conversion of an output signal of the output/measurement circuit 30a connected to the data line S1 are performed at a same timing. At time t2, A/D conversion of the output signal of the output/measurement circuit 30b connected to the dummy wiring D1 (two in total) and A/D conversion of an output signal of the output/measurement circuit 30a connected to the data line S2 are performed at a same timing. Similarly, at times t3 to tp, A/D conversion of the output signal of the output/measurement circuit 30b connected to the dummy wiring D1 (two in total) and A/D conversion of an output signal of the output/measurement circuit 30a connected to one of the data lines S3 to Sp are performed at a same timing. The noise in the current measurement can be removed effectively, by performing A/D conversion of the result of the main measurement and A/D conversion of the result of the dummy measurement at the same timing.

Figure 12:
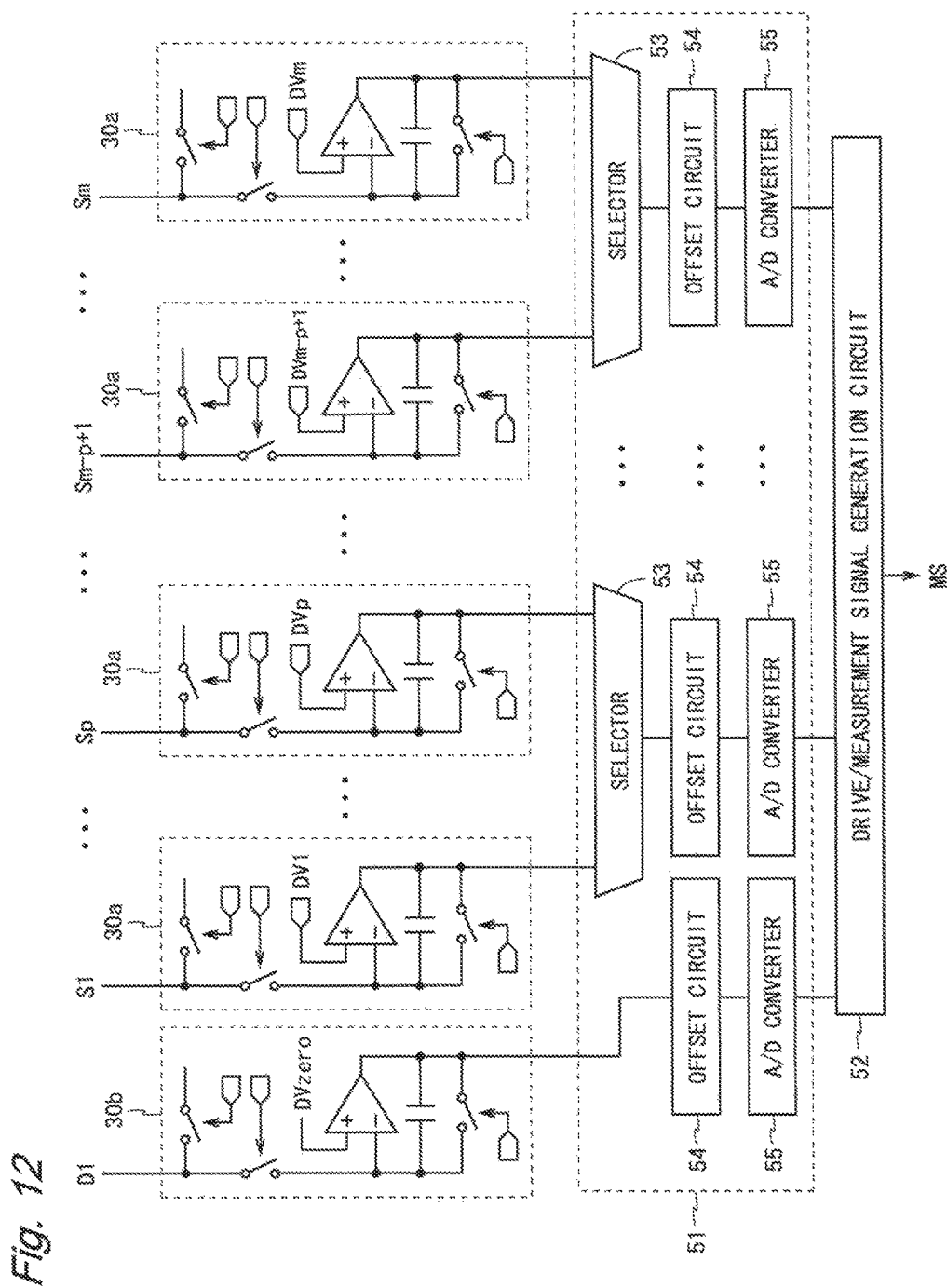
FIG. 12 is a diagram showing a part of a data line drive/current measurement circuit of a display device according to a variant of the fourth embodiment of the present invention in detail.

Note that although the number of the dummy wirings is (m/p) in the above description, the number of the dummy wirings is arbitrary so long as it is not less than one. For example, when the number of the dummy wiring is one, the data line drive/current measurement circuit has a configuration shown in FIG. 12. Furthermore, a circuit other than the dummy wiring may be used as a dummy measurement target circuit.

As described above, the display device according to the present embodiment includes one or more dummy measurement target circuits (dummy wirings D1 to Dm/p). Each of a part of the measurement units (output/measurement circuit 30a) is provided corresponding to the data lines S1 to Sm, and each of the remaining measurement units (output/measurement circuit 30b) is provided corresponding to the dummy measurement target circuit. A current measurement circuit (part of the data line drive/current measurement circuit 50) supplies the dummy signal (zero voltage) to the remaining measurement units, and measures the current flowing through the dummy measurement target circuit. It is possible to measure the current flowing through the pixel circuits 20 having the same number (m) as that of the data lines through one main measurement, by providing the dummy measurement target circuit and performing the dummy measurement for measuring the current flowing through the dummy measurement target circuit. Furthermore, the dummy measurement can be performed under the same condition as that for the main measurement, by using the dummy measurement target circuit having the same load as those of the data lines S1 to Sm. Furthermore, the current measurement circuit includes the selector 53 for selecting outputs of the part of the measurement units. Therefore, it is possible to select the result of the main measurement using the selector 53 and perform the calculation on the selected result of the main measurement and the result of the dummy measurement.

Furthermore, the current measurement circuit includes the A/D converter 55 for converting the analog signal representing the result of measuring the current with respect to the pixel circuit 20 to the digital value, and performs A/D conversion of the result of the main measurement and A/D conversion of the result of the dummy measurement at a same timing. With this, the noise in the current measurement can be removed effectively.

Fifth Embodiment

In the first to fourth embodiments, display devices including a current measurement circuit for measuring a current with respect to a pixel circuit have been described. In a fifth embodiment, a display device including a voltage measurement circuit for measuring a voltage with respect to a pixel circuit will be described.

Figure 13:
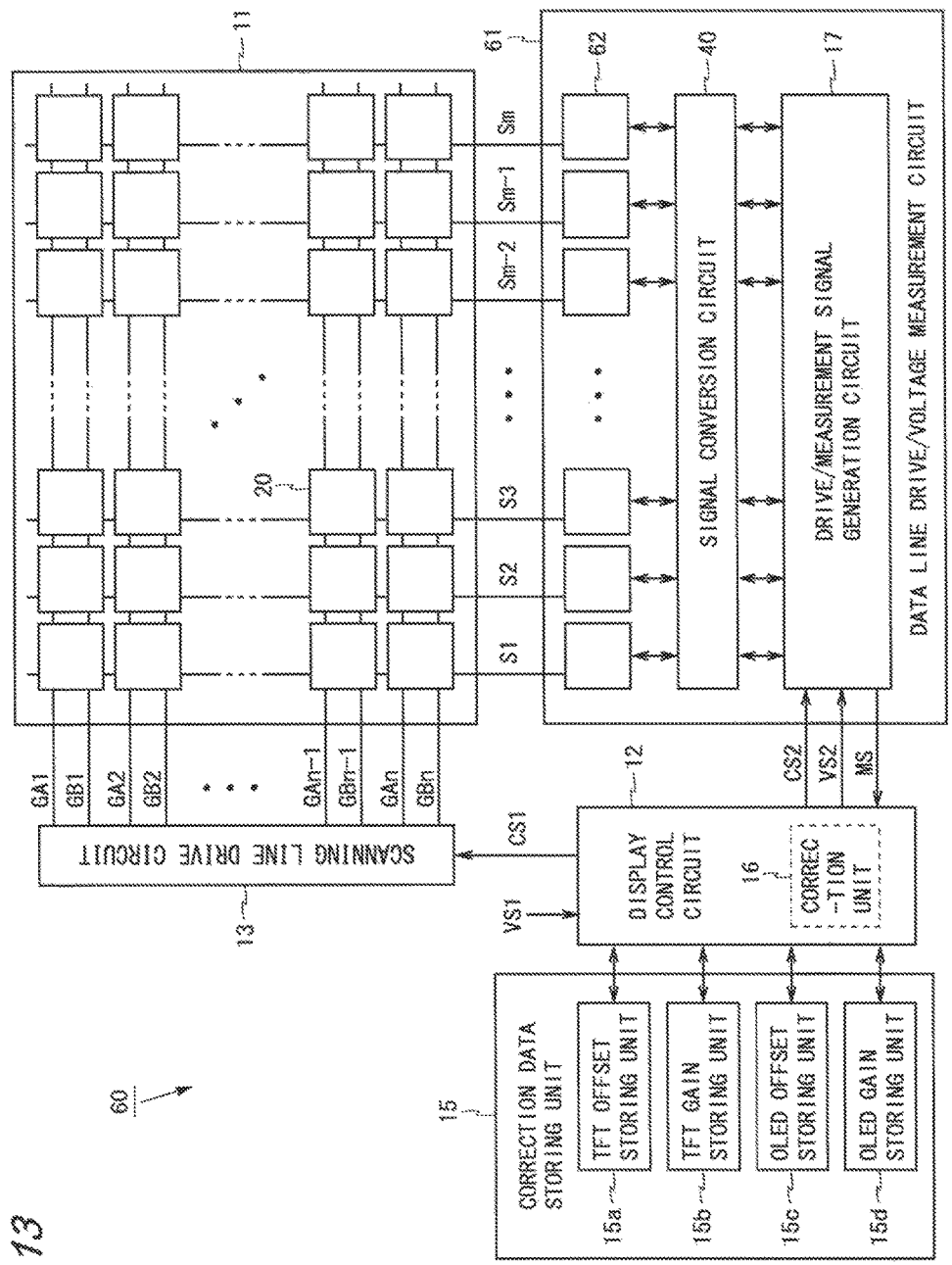
FIG. 13 is a block diagram showing a configuration of a display device according to a fifth embodiment of the present invention.

FIG. 13 is a block diagram showing a configuration of a display device according to a fifth embodiment of the present invention. A display device 60 shown in FIG. 13 is obtained based on the display device 10 (FIG. 1) according to the first embodiment by replacing the data line drive/current measurement circuit 14 with a data line drive/voltage measurement circuit 61 (a combined circuit of a data line drive circuit and a voltage measurement circuit). The data line drive/voltage measurement circuit 61 includes the drive/measurement signal generation circuit 17, the signal conversion circuit 40, and m output/measurement circuits 62.

Figure 14:
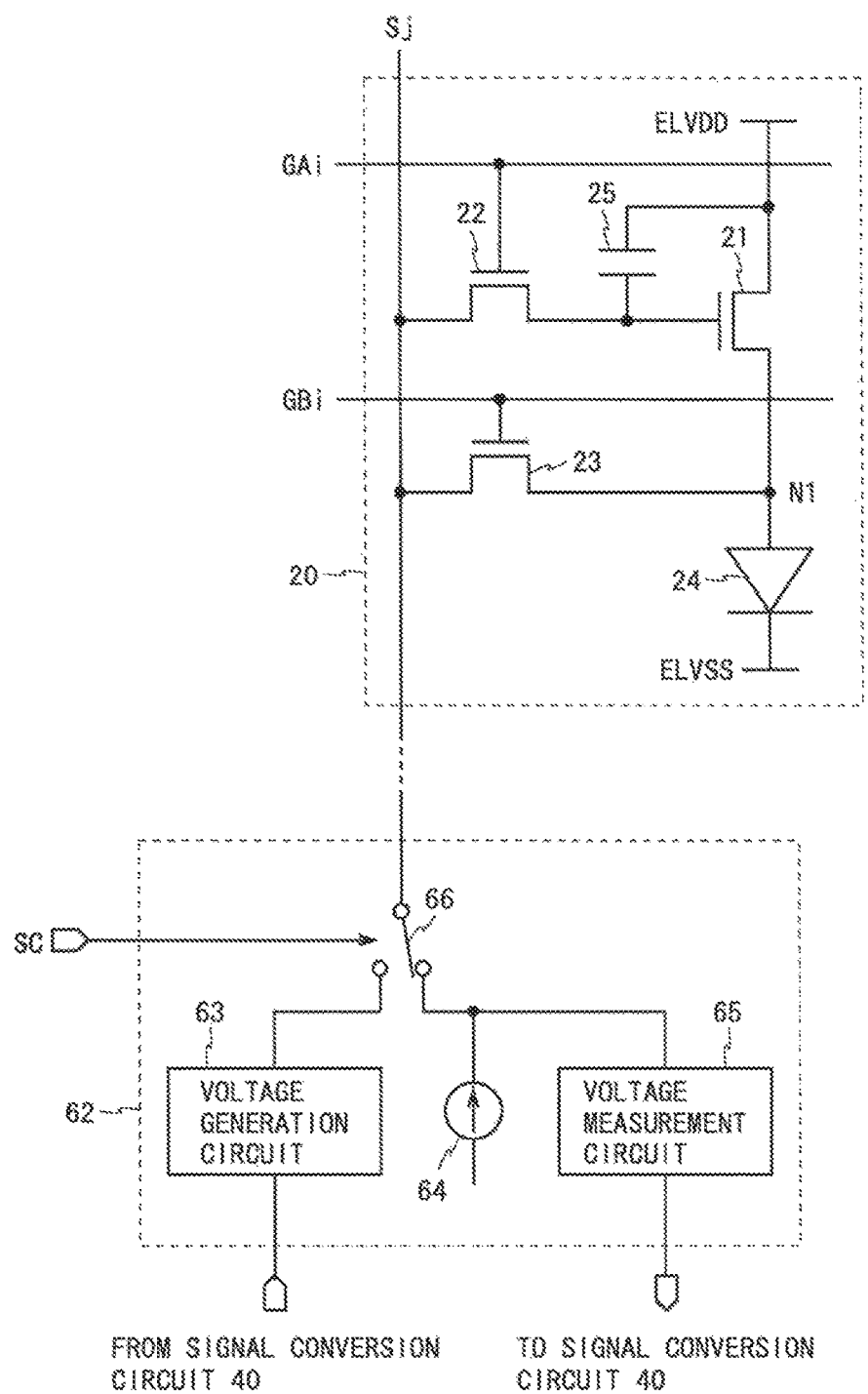
FIG. 14 is a diagram showing a configuration of a pixel circuit and an output/measurement circuit of the display device shown in FIG. 13.
Figure 15:
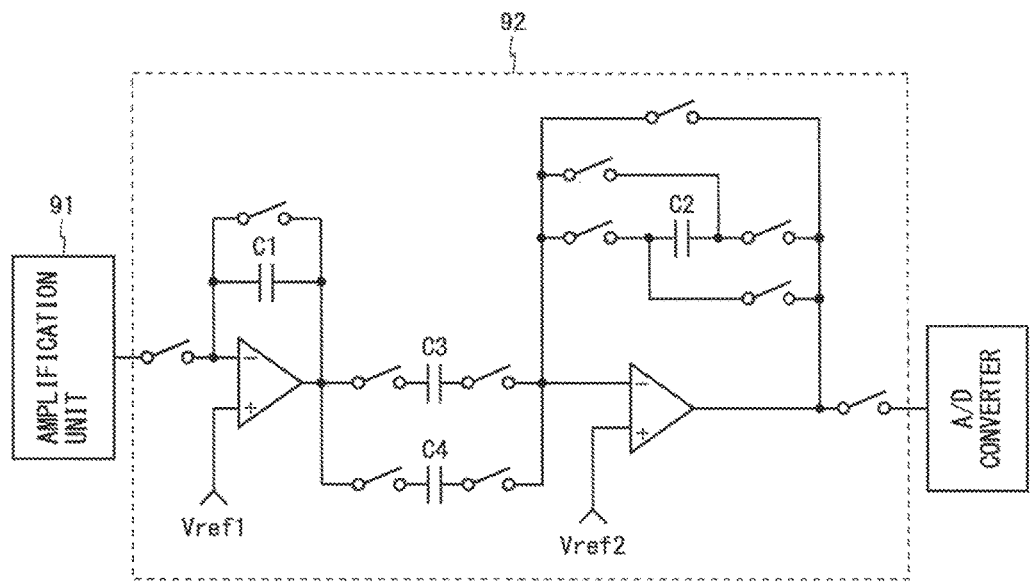
FIG. 15 is a diagram showing a configuration of a sensing unit included in a conventional display device.

FIG. 14 is a diagram showing a configuration of the pixel circuit 20 and the output/measurement circuit 62. FIG. 14 depicts the pixel circuit 20 in the i-th row and the j-th column and an output/measurement circuit 62 corresponding to the data line Sj. The configuration of the pixel circuit 20 is the same as that in the first embodiment. Hereinafter, a node to which the source terminal of the transistor 21 and the anode terminal of the organic EL element 24 are connected is referred to as N1.

The output/measurement circuit 62 includes a voltage generation circuit 63, a current source 64, a voltage measurement circuit 65, and a switch 66. One end of the switch 66 is connected to the data line Sj. The switch 66 switches whether the data line Sj is connected to the voltage generation circuit 63 or to the current source 64 and the voltage measurement circuit 65, in accordance with a switch control signal SC.

The voltage generation circuit 63 outputs a data voltage based on a digital data output from the signal conversion circuit 40, or outputs a reference voltage. When the data line Sj is connected to the voltage generation circuit 63, the data voltage or the reference voltage output from the voltage generation circuit 63 is applied to the data line Sj. When the data line Sj is connected to the current source 64 and the voltage measurement circuit 65, the current source 64 makes a predetermined amount of current flow to the data line Sj, and the voltage measurement circuit 65 measures a voltage of the data line Sj at that time.

In order to correct the video signal VS1 to obtain the video signal VS2, the data line drive/voltage measurement circuit 61 measures four kinds of voltages with respect to each pixel circuit 20. More specifically, in order to obtain the characteristics of the transistor 21 in each pixel circuit 20, the data line drive/voltage measurement circuit 61 measures a voltage Vn1 of the node N1 when a reference voltage with which the transistor 21 turns on is written to the pixel circuit 20 and a first measurement current In1 flows from the current source 64, a voltage Vn2 of the node N2 (two in total) when a voltage with which the transistor 21 turns on is written to the pixel circuit 20 and a second measurement current In2 (>In1) flows from the current source 64, a voltage Vn3 of the node N when a voltage with which the transistor 21 turns off is written to the pixel circuit 20 and a third measurement current In3 flows from the current source 64, and a voltage Vn4 of the node N2 (two in total) when a voltage with which the transistor 21 turns off is written to the pixel circuit 20 and a fourth measurement current In4 (>In3) flows from the current source 64.

The scanning line drive circuit 13 and the data line drive/voltage measurement circuit 61 perform a processing for writing to the pixel circuits 20 in one row, and a processing for measuring one of four kinds of the voltages Vn1 to Vn4 with respect to the pixel circuits 20 in one row. For example, in four consecutive frame periods, the scanning line drive circuit 13 and the data line drive/voltage measurement circuit 61 may measure the voltages Vn1 to Vn4 with respect to the pixel circuits 20 in the i-th row in an i-th line period in first to fourth frame periods, respectively, and may perform a processing for writing to the pixel circuits 20 in one row in other line periods.

The correction unit 16 performs a processing for obtaining the characteristics of the transistor 21 and the organic EL element 24 based on the measured four kinds of the voltages Vn1 to Vn4, and corrects the video signal VS1 based on the obtained two kinds of characteristics. More specifically, the correction unit 16 obtains the threshold voltage and the gain as the characteristics of the transistor 21 based on two kinds of the voltages Vn1, Vn2, and obtains the threshold voltage and the gain as the characteristics of the organic EL element 24 based on the two kinds of the voltages Vn3, Vn4. The method for obtaining the threshold voltage and the gain of the transistor 21, and the threshold voltage and the gain of the organic EL element 24 are the same as those in the first embodiment. The correction unit 16 writes the obtained threshold voltage and the obtained gain to the correction data storing unit 15, and corrects the video signal VS1 using the threshold voltage and the gain read from the correction data storing unit 15.

As described above, the display device 60 according to the present embodiment includes, as a measurement circuit in place of the current measurement circuit, the voltage measurement circuit 65 for measuring the voltages Vn1 to Vn4 of the node N1 in the pixel circuit 20, and includes the correction unit 16 for correcting the video signal VS1 to be supplied to the data line drive circuit (part of the data line drive/voltage measurement circuit 61), based on the voltages Vn1 to Vn4 measured by the voltage measurement circuit 65.

According to the display device 60 of the present embodiment, as with the display device 10 according to the first embodiment, it is possible to remove noise in measurement when measuring the voltage of the node N1 in the pixel circuit 20, by performing the main measurement and the dummy measurement at a same timing and performing a calculation on the result of the main measurement and the result of the dummy measurement. Furthermore, high image quality display can be performed by using the result of the voltage measurement.

Note that although the above-described display device according to each embodiment includes the pixel circuit 20 and the output/measurement circuit 30, the display device may include other pixel circuit, or may include other output/measurement circuit.

As described above, according to the display device of the present invention, it is possible to remove noise in measurement when measuring a current or a voltage with respect to a pixel circuit, by performing a main measurement and a dummy measurement at a same timing and obtaining a difference between a result of the main measurement and a result of the dummy measurement. Furthermore, high image quality display can be performed by using the result of measuring the current or the voltage.

INDUSTRIAL APPLICABILITY

The display device of the present invention has a feature that noise in measurement when measuring a current or a voltage with respect to a pixel circuit can be removed. Thus, the display device can be used for various kinds of display devices having a pixel circuit including an electro-optical element, such as an organic EL display device.

DESCRIPTION OF REFERENCE CHARACTERS 10, 60: DISPLAY DEVICE
11: DISPLAY UNIT
12: DISPLAY CONTROL CIRCUIT
13: SCANNING LINE DRIVE CIRCUIT
14, 50: DATA LINE DRIVE/CURRENT MEASUREMENT CIRCUIT
15: CORRECTION DATA STORING UNIT
16: CORRECTION UNIT
17, 52: DRIVE/MEASUREMENT SIGNAL GENERATION CIRCUIT
20: PIXEL CIRCUIT
21: TRANSISTOR (DRIVE TRANSISTOR)
22: TRANSISTOR (WRITE CONTROL TRANSISTOR)
23: TRANSISTOR (READ CONTROL TRANSISTOR)
24: ORGANIC EL ELEMENT (ELECTRO-OPTICAL ELEMENT)
25, 32: CAPACITOR
30, 62: OUTPUT/MEASUREMENT CIRCUIT
31: OPERATIONAL AMPLIFIER
33 TO 35, 66: SWITCH
40, 51: SIGNAL CONVERSION CIRCUIT
41, 53: SELECTOR
42, 54: OFFSET CIRCUIT
43, 55: A/D CONVERTER

61: DATA LINE DRIVE/VOLTAGE MEASUREMENT CIRCUIT
63: VOLTAGE GENERATION CIRCUIT
64: CURRENT SOURCE
65: VOLTAGE MEASUREMENT CIRCUIT
GA1 TO GAn, GB1 TO GBn: SCANNING LINE
S1 TO Sm: DATA LINE

The invention claimed is:

1. An active-matrix type display device comprising:
   a display unit including n pieces of scanning lines, wherein n is an integer equal to or more than two, m pieces of data lines, wherein m is an integer equal to or more than two and (m×n) pieces of pixel circuits arranged two-dimensionally;
   a scanning line drive circuit configured to drive the scanning lines;
   a data line drive circuit configured to drive the data lines; and
   a measurement circuit including a plurality of measurement units and configured to measure a current or a voltage with respect to the pixel circuit, wherein
   the measurement unit is connected to the data line,
   the data lines and the measurement units are classified into first and second groups,
   each of the first and second groups includes one or p pieces of adjacently arranged data lines, wherein p is an integer equal to or more than two,
   the measurement circuit is configured to perform, at a same timing, a main measurement for measuring the current or the voltage via the data line with respect to the pixel circuit with supplying a measurement signal to a part of the measurement units and a dummy measurement for measuring a current or a voltage via the data line with supplying a dummy signal to at least a part of remaining measurement units, the dummy signal being a signal with which a value to be measured is approximately zero, and perform a calculation on a result of the main measurement and a result of the dummy measurement, and
   the measurement circuit is configured to perform the main measurement using the measurement unit in the first group and the dummy measurement using the measurement unit in the second group at a same timing in a first period, and perform the main measurement using the measurement unit in the second group and the dummy measurement using the measurement unit in the first group at a same timing in a second period.

2. The display device according to claim 1, wherein
   each of the m pieces of data lines is included in one of the first and second groups, and
   the p pieces of adjacently arranged data lines in the first group and the p pieces of adjacently arranged data lines in the second group are arranged alternately.

3. The display device according to claim 1, wherein
   each of the m pieces of data lines is included in one of the first and second groups,
   the first group includes odd-numbered data lines, and
   the second group includes even-numbered data lines.

4. The display device according to claim 1, wherein the measurement circuit further includes a selector configured to select outputs from the measurement units in the first group, and a selector configured to select outputs from the measurement units in the second group.

5. The display device according to claim 2, wherein
   p is three,
   the pixel circuit has one of mutually different first to third display colors for each corresponding data line, and
   each of the first and second groups includes three data lines corresponding to the first to third display colors, as three pieces of adjacently arranged data lines.

6. An active-matrix type display device comprising:
   a display unit including n pieces of scanning lines, wherein n is an integer equal to or more than two, m pieces of data lines, wherein m is an integer equal to or more than two, and (m×n) pieces of pixel circuits arranged two-dimensionally;
   a scanning line drive circuit configured to drive the scanning lines;
   a data line drive circuit configured to drive the data lines;
   a measurement circuit including a plurality of measurement units and configured to measure a current or a voltage with respect to the pixel circuit, and
   one or more dummy measurement target circuits, wherein
   among the plurality of measurement units, each of a part of the measurement units is provided corresponding to the data line, and each of remaining measurement units is provided corresponding to the dummy measurement target circuit,
   the measurement circuit is configured to perform, at a same timing, a main measurement for measuring the current or the voltage with respect to the pixel circuit with supplying a measurement signal to the part of the measurement units and a dummy measurement for measuring a current or a voltage with respect to the dummy measurement target circuit with supplying a dummy signal to at least the part of the remaining measurement units, the dummy signal being a signal with which a value to be measured is approximately zero, and perform a calculation on a result of the main measurement and a result of the dummy measurement,
   the data lines and the measurement units are classified into a plurality of groups,
   each of the plurality of groups includes p pieces of adjacently arranged data lines, wherein p is an integer equal to or more than two, and
   the measurement circuit is configured to perform, for each group, the dummy measurement with respect to the dummy measurement target circuit that is commonly used, while performing the main measurement with respect to the p pieces of adjacently arranged data lines in the group.

7. The display device according to claim 6, wherein the dummy measurement target circuit has a same load as that of the data line.

8. The display device according to claim 6, wherein the measurement circuit further includes a selector configured to select outputs of the part of the measurement units.

9. The display device according to claim 1, further comprising a correction unit configured to correct a video signal to be supplied to the data line drive circuit, based on the current or the voltage measured by the measurement circuit.

10. The display device according to claim 1, wherein the pixel circuit includes an electro-optical element, and a drive transistor connected in series with the electro-optical element.

11. The display device according to claim 10, further comprising:
    a correction unit configured to correct a video signal to be supplied to the data line drive circuit, based on the current or the voltage measured by the measurement circuit; and
    a storing unit configured to store a threshold voltage and a gain of the electro-optical element and the drive transistor for each pixel circuit, wherein the correction unit is configured to obtain the threshold voltage and the gain to be stored in the storing unit, based on the current or the voltage measured by the measurement circuit, and correct the video signal based on the threshold voltage and the gain stored in the storing unit.

12. The display device according to claim 10, wherein the pixel circuit includes:
a write control transistor having a first conduction terminal connected to the data line, a second conduction terminal connected to a control terminal of the drive transistor, and a control terminal connected to a first scanning line in the scanning lines; and
a read control transistor having a first conduction terminal connected to the data line, a second conduction terminal connected to a connection point of the drive transistor and the electro-optical element, and a control terminal connected to a second scanning line in the scanning lines.

13. The display device according to claim 1, wherein the measurement circuit further includes an A/D converter configured to convert an analog signal to a digital value, the analog signal representing a result of measuring the current or the voltage with respect to the pixel circuit, and is configured to perform A/D conversion of the result of the main measurement and A/D conversion of the result of the dummy measurement at a same timing.

14. The display device according to claim 1, wherein the measurement circuit is a current measurement circuit configured to measure a current flowing through the pixel circuit.

15. The display device according to claim 14, wherein the data line drive circuit and the current measurement circuit share an amplifier.

16. The display device according to claim 1, wherein the measurement circuit is a voltage measurement circuit configured to measure a voltage of a node in the pixel circuit.

17. A drive method for an active-matrix type display device having a display unit including n pieces of scanning lines, wherein n is an integer equal to or more than two, m pieces of data lines, wherein m is an integer equal to or more than two, and (m×n) pieces of pixel circuits arranged two-dimensionally, the method comprising the steps of:
driving the scanning lines;
driving the data lines; and
measuring a current or a voltage with respect to the pixel circuit using a plurality of measurement units, wherein the measurement unit is connected to the data line,
the data lines and the measurement units are classified into first and second groups,
each of the first and second groups includes one or p pieces of adjacently arranged data lines, wherein p is an integer equal to or more than two,
the measuring includes:
performing, at a same timing, a main measurement for measuring the current or the voltage via the data line with respect to the pixel circuit with supplying a measurement signal to a part of the measurement units and a dummy measurement for measuring a current or a voltage via the data line with supplying a dummy signal to at least a part of remaining measurement units, the dummy signal being a signal with which a value to be measured is approximately zero; and
performing a calculation on a result of the main measurement and a result of the dummy measurement, and
in the measuring, the main measurement using the measurement unit in the first group and the dummy measurement using the measurement unit in the second group are performed at a same timing in a first period, and the main measurement using the measurement unit in the second group and the dummy measurement using the measurement unit in the first group are performed at a same timing in a second period.

18. The display device according to claim 10, wherein
a reset period is provided at a beginning of a selection period in measuring the current, and
the drive transistor is controlled to turn off in the reset period.

19. The display device according to claim 2, wherein the measurement circuit is configured to, in the first period, perform the main measurement with respect to the p pieces of adjacently arranged data lines in the first group and the dummy measurement with respect to the p pieces of adjacently arranged data lines in the second group at a same timing sequentially, and perform the calculation on the result of the main measurement and the result of the dummy measurement.

20. The display device according to claim 5, wherein the measurement circuit is configured to, in the first period, perform the main measurement with respect to the data line in the first group and corresponding to the first display color and the dummy measurement with respect to the data line in the second group and corresponding to the first display color at a same timing, and perform the calculation on the result of the main measurement and the result of the dummy measurement.

* * * * *